(12) United States Patent
Lee et al.

(10) Patent No.: US 9,893,074 B2
(45) Date of Patent: Feb. 13, 2018

(54) SEMICONDUCTOR DEVICE

(71) Applicant: SAMSUNG ELECTRONICS CO., LTD., Suwon-si, Gyeonggi-do (KR)

(72) Inventors: Jae Goo Lee, Suwon-si (KR); Young Woo Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 38 days.

(21) Appl. No.: 14/662,919

(22) Filed: Mar. 19, 2015

(65) Prior Publication Data

US 2015/0372101 A1 Dec. 24, 2015

(30) Foreign Application Priority Data

Jun. 24, 2014 (KR) ........................ 10-2014-0077186

(51) Int. Cl.
*H01L 29/792* (2006.01)
*H01L 29/788* (2006.01)
*H01L 27/11556* (2017.01)
*H01L 27/11565* (2017.01)
*H01L 27/11582* (2017.01)
*H01L 27/11519* (2017.01)
*H01L 27/11548* (2017.01)
*H01L 27/11575* (2017.01)
*H01L 29/66* (2006.01)
*H01L 29/78* (2006.01)
*H01L 29/49* (2006.01)

(52) U.S. Cl.
CPC .. *H01L 27/11556* (2013.01); *H01L 27/11519* (2013.01); *H01L 27/11548* (2013.01); *H01L 27/11565* (2013.01); *H01L 27/11575* (2013.01); *H01L 27/11582* (2013.01); *H01L 29/66666* (2013.01); *H01L 29/7827* (2013.01); *H01L 29/4975* (2013.01)

(58) Field of Classification Search
CPC ......... H01L 27/11565; H01L 27/11573; H01L 27/11575; H01L 27/11578; H01L 27/11582

See application file for complete search history.

(56) References Cited

U.S. PATENT DOCUMENTS

2009/0267128 A1 10/2009 Maejima
2010/0117054 A1 5/2010 Kim et al.
(Continued)

FOREIGN PATENT DOCUMENTS

JP 2010-199314 9/2010
JP 2011-66060 3/2011
(Continued)

*Primary Examiner* — Matthew Landau
*Assistant Examiner* — Scott Stowe
(74) *Attorney, Agent, or Firm* — Lee & Morse, P.C.

(57) ABSTRACT

A semiconductor device including a substrate, channels, a gate stack, and a pad separating region. The substrate has a pad region adjacent to a cell region. The channels extend in a direction crossing an upper surface of the substrate in the cell region. The gate stack includes a plurality of gate electrode layers spaced apart from each other on the substrate and enclosing the channels in the cell region. The pad separating region separates the gate stack into two or more regions in the pad region. The gate electrode layers have different lengths in the pad region.

11 Claims, 32 Drawing Sheets

(56) References Cited

U.S. PATENT DOCUMENTS

| | | |
|---|---|---|
| 2010/0213537 A1 | 8/2010 | Fukuzumi et al. |
| 2011/0147801 A1* | 6/2011 | Shim ................. H01L 27/11551 257/211 |
| 2011/0220987 A1 | 9/2011 | Tanaka et al. |
| 2012/0171863 A1 | 7/2012 | Suzuki et al. |
| 2012/0241846 A1 | 9/2012 | Kawasaki et al. |
| 2013/0009229 A1 | 1/2013 | Lee et al. |
| 2013/0148398 A1 | 6/2013 | Baek et al. |
| 2013/0161821 A1 | 6/2013 | Hwang et al. |
| 2013/0200331 A1 | 8/2013 | Morikawa et al. |
| 2014/0199815 A1* | 7/2014 | Hwang ............. H01L 29/66833 438/270 |

FOREIGN PATENT DOCUMENTS

| | | |
|---|---|---|
| JP | 2011-187794 | 9/2011 |
| KR | 2010-0053205 | 5/2010 |
| KR | 10-2011-0015337 A | 2/2011 |
| KR | 10-2013-0006272 | 1/2013 |
| KR | 10-2013-0072522 | 7/2013 |

\* cited by examiner

SEMICONDUCTOR DEVICE

CROSS-REFERENCE TO RELATED APPLICATION

Korean Patent Application No. 10-2014-0077186, filed on Jun. 24, 2014, and entitled, "Semiconductor Device," is incorporated by reference herein in its entirety.

BACKGROUND

1. Field

One or more embodiments described herein relate to a semiconductor device.

2. Description of the Related Art

Data processing and storage continues to be a focus of electronic product development. Today, electronic products are required to process ever-increasing amounts of data, while having a reduced size. The degree of integration of the semiconductor devices in these products may be increased to achieve these design and performance objectives. One approach for increasing integration involves fabricating semiconductor devices to have a vertical transistor structure, instead of the planar structure which has traditionally been used.

SUMMARY

In accordance with one embodiment, a semiconductor device includes a substrate having a pad region adjacent to a cell region; a plurality of channels extending in a first direction crossing an upper surface of the substrate in the cell region; a gate stack including a plurality of gate electrode layers spaced apart from each other in a second direction on the substrate and enclosing the plurality of channels in the cell region, the plurality of gate electrode layers having different lengths in the pad region; and a pad separating region crossing the gate stack and separating the gate stack into two or more regions in the pad region.

The at least one of the plurality of gate electrode layers may form a single region in the cell region and may be separated into two or more regions by the pad separating region in the pad region. The gate stack may extend toward the pad region from the cell region, and the pad separating region may be between the two or more regions of the gate stack in a second direction intersecting a direction in which the gate stack and pad separating region extend.

The pad separating region may include a dummy source line and an insulating layer electrically separating the dummy source line from the gate stack. The device may include a common source line on at least one side of the gate stack and extending along the cell region and the pad region, and the dummy source line may have a shape substantially equal to a shape of the common source line. The dummy source line may extend to be substantially parallel to the common source line. The dummy source line may be on the substrate and may extend to a position higher than a position of an uppermost gate electrode layer, among the plurality of gate electrode layers. The dummy source line may be a doped region within the substrate.

The device may include a dummy pillar enclosed by the gate stack in the pad region. The dummy pillar may include a substantially planar area larger than a planar area of a channel pillar including the channel. The device may include a plurality of contact plugs respectively connected to the plurality of gate electrode layers in the pad region. The plurality of gate electrode layers may include a metal silicide. The metal silicide may be a fully silicided metal in the pad region.

In accordance with another embodiment, a semiconductor device includes a substrate having a pad region adjacent to a cell region; a plurality of channels extending in a direction crossing an upper surface of the substrate in the cell region; a gate stack including a plurality of gate electrode layers spaced apart from each other in a first direction on the substrate and enclosing the plurality of channels in the cell region, the plurality of gate electrode layers having different lengths in the pad region; a common source line on at least one side of the gate stack and extending along the cell region and the pad region; and a dummy source line between portions of the gate stack in the pad region. The common source line and the dummy source line may not be electrically connected to each other.

In accordance with another embodiment, a semiconductor device includes a substrate having a pad region and a cell region; a plurality of channels in the cell region; a stack of gate electrode layers enclosing the plurality of channels in the cell region, the plurality of gate electrode layers having different lengths in the pad region; and a separating region separating the gate stack into a plurality of regions in the pad region.

The gate stack may extend from the cell region toward the pad region, and the separating region may be between the plurality of regions of the gate stack. The separating region may includes a dummy source line and an insulating layer electrically separating the dummy source line from the gate stack. The device may include a common source line adjacent the gate stack and extending along the cell region and the pad region, and the dummy source line may have a shape substantially equal to a shape of the common source line. The dummy source line may extend to a position higher than a position of an uppermost one of the gate electrode layers.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
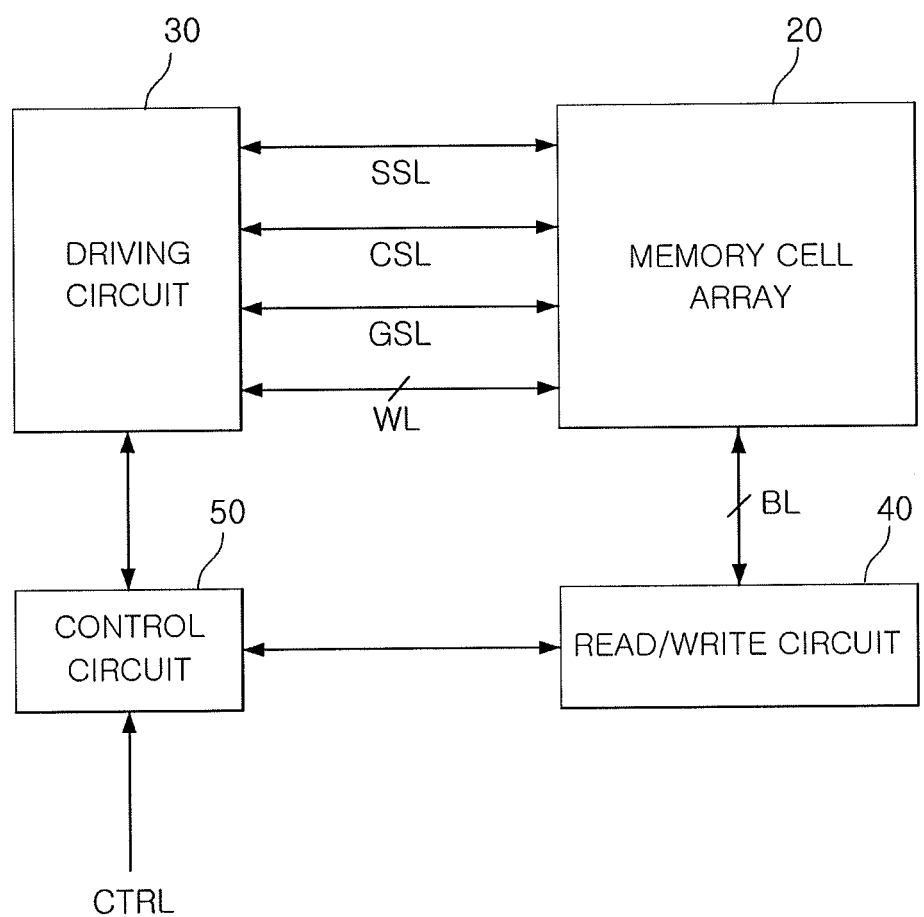
FIG. 1 illustrates an embodiment of a semiconductor device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of a semiconductor device 10 including a memory cell array 20, a driving circuit 30, a read/write circuit 40, and a control circuit 50.

The memory cell array 20 includes a plurality of memory cells arranged in rows and columns. The memory cells are connected to the driving circuit 30 through one or more signal lines, e.g., word lines WL, common source lines CSL, string select lines SSL, and ground select lines GSL. The memory cells are connected to the read/write circuit 40 through bit lines BL. In one embodiment, memory cells in the same row may be connected to the same word line WL, and memory cells in the same column may be connected the same bit line BL.

The memory cells of the memory cell array 20 may be grouped into a plurality of memory blocks. In one embodiment, each memory block may include a plurality of word lines WL, a plurality of string select lines SSL, a plurality of ground select lines GSL, a plurality of bit lines BL, and at least one common source line CSL.

The driving circuit 30 and the read/write circuit 40 may be operated by the control circuit 50. For example, the driving circuit 30 may receive address information from the control circuit 50 and decode the received address information to select at least a portion of the word lines WL, the common source lines CSL, the string select lines SSL, and the ground select lines GSL. The driving circuit 30 may include driving circuit units for the respective word lines WL, the string select lines SSL, and the common source lines CSL.

The read/write circuit 40 may select one or more of the bit lines BL connected to the memory cell array 20 in response to a command received from the control circuit 50. The read/write circuit 40 may read data stored in the memory cell(s) connected to the selected bit lines BL, or may write data in the memory cell(s) connected to the selected the bit lines BL. The read/write circuit 40 may include a number of circuits for performing the read and write operations. For example, the read/write circuit 40 may include a page buffer, an input/output buffer, and a data latch to perform these operations.

The control circuit 50 may control the driving circuit 30 and the read/write circuit 40 in response to a control signal CTRL from an external source. When data stored in the memory cell array 20 is read, the control circuit 50 may control an operation of the driving circuit 30 to supply a reading operation voltage to the word line WL in which data to be read is stored. When the reading operation voltage is supplied to a certain word line WL, the control circuit 50 may control the read/write circuit 40 to read data stored in the memory cell connected to the word line WL, to which the reading operation voltage is supplied.

When data is written to the memory cell array 20, the control circuit 50 may control an operation of the driving circuit 30 to supply a writing operation voltage to the word line WL in which data is to be written. When the writing operation voltage is supplied to the certain word line WL, the control circuit 50 may control the read/write circuit 40 to write data to the memory cell connected to the word line (WL) to which the writing operation voltage is supplied.

Figure 2:
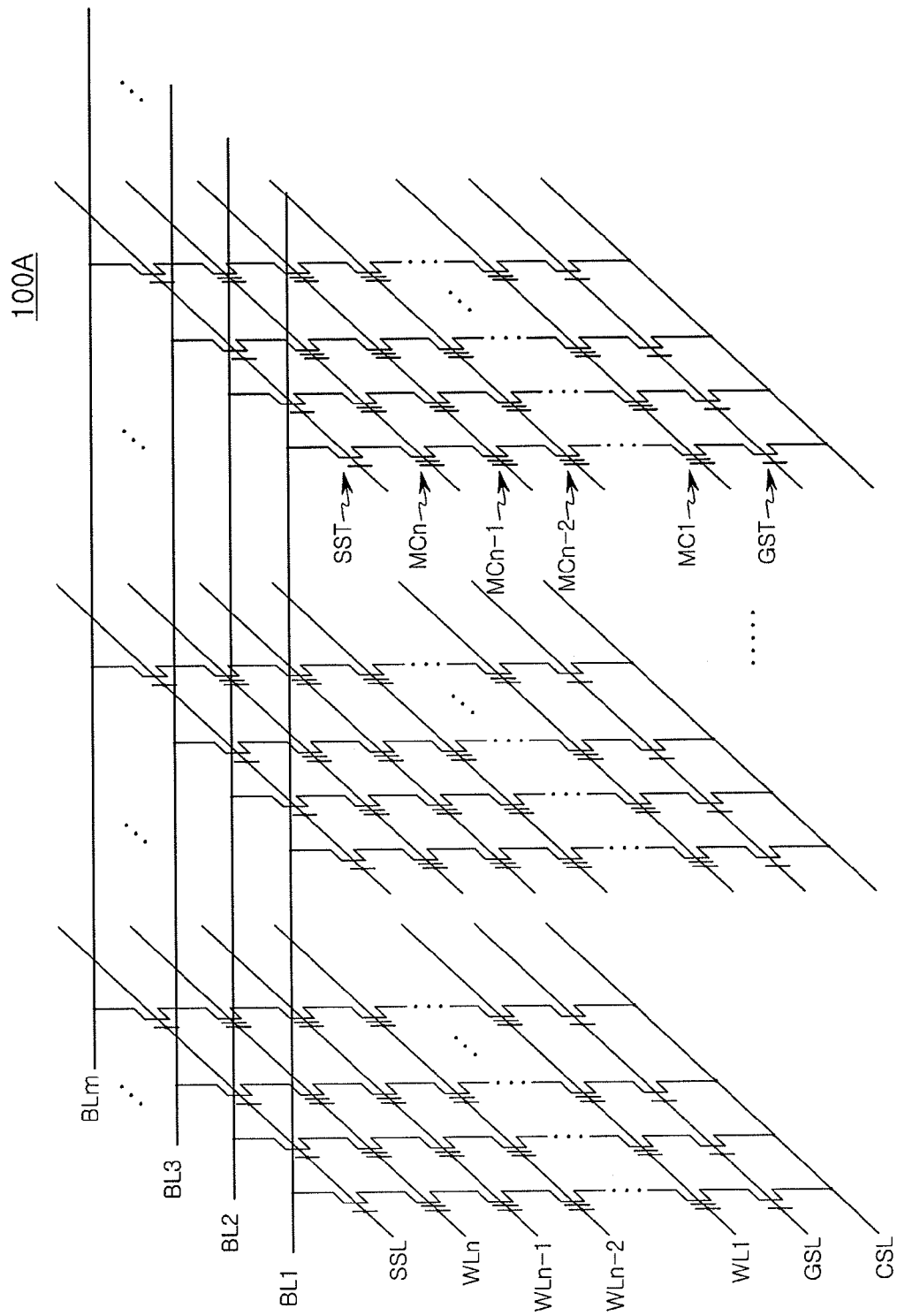
FIG. 2 illustrates an embodiment of a memory cell array.

FIG. 2 illustrates an equivalent circuit of a memory cell array of a semiconductor device 100A. The memory cell array may correspond, for example, to the memory cell array 20 in FIG. 1.

Referring to FIG. 2, the memory cell array in the semiconductor device 100A has a vertical three-dimensional structure. The memory cell array includes a plurality of memory cell strings, including n-number of memory cell elements MC1 to MCn connected in series, a ground select transistor GST, and a string select transistor SST connected in series to terminals of the memory cell elements MC1 to MCn.

The n-number of memory cell elements MC1 to MCn are connected to the word lines WL1 to WLn, for selecting one or more of the memory cell elements MC1 to MCn, respectively. The ground select transistor GST has a gate terminal connected to the ground select line GSL and a source terminal connected to the common source line CSL. The string select transistor SST has a gate terminal connected to the string select line SSL and a source connected to a drain terminal of one or more of the memory cell elements MC1 to MCn.

In FIG. 2, a structure is illustrated in which a single ground select transistor GST and a single string select transistor SST are connected to the n-number of memory cell elements MC1 to MCn. In another embodiment, a plurality of ground select transistors GST and/or a plurality of string select transistors SST may be connected to the n-number of memory cell elements MC1 to MCn.

The string select transistor SST has a drain terminal connected to one or more of the bit lines BL1 to BLm. When a signal is applied to the gate terminal of the string select transistor SST through the string select line SSL, a signal applied through the bit lines BL1 to BLm may be transferred to the n-number of memory cell elements MC1 to MCn, to perform a data reading or writing operation. Further, a signal is applied to a gate terminal of a gate select transistor GST through a gate select line GSL. The gate select transistor GST has a source terminal connected to the common source line CSL. When this occurs, an erase operation is performed for removing all charges stored in the n-number of memory cell elements MC1 to MCn.

Figure 3:
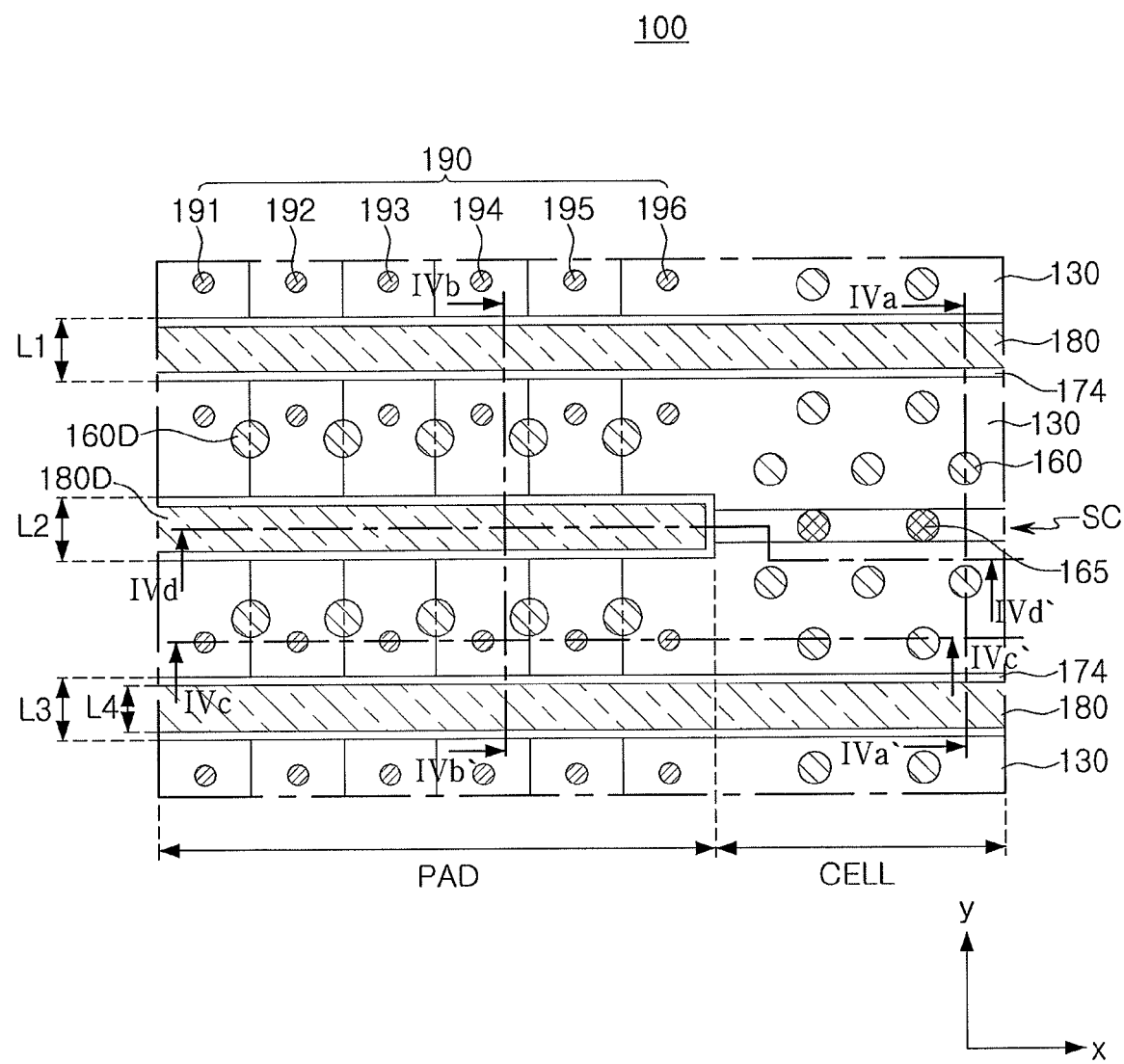
FIG. 3 illustrates another view of the semiconductor device.

FIG. 3 illustrates an embodiment of a semiconductor 100. FIGS. 4A through 4D are cross-sectional views of the semiconductor device 100 taken along cut lines IVa-IVa', IVb-IVb', IVc-IVc' and IVd-IVd' in FIG. 3, respectively. For convenience of understanding, some components (e.g., a fourth insulating layer 176—see FIGS. 4A through 4D) are omitted in FIG. 3.

Referring to FIG. 3, the semiconductor device 100 includes a cell region CELL and a pad region PAD. The pad region PAD may be disposed in at least one end of the cell region CELL in an x-direction. The cell region CELL may correspond to the memory cell array 20 of FIG. 1, and the pad region PAD may correspond to a region electrically connecting the memory cell array 20 and the driving circuit 30.

Further, the semiconductor device 100 includes gate stacks 130, drain pads 160, dummy pillars 160D, separation region dummy pillars 165, a common source line 180, a dummy common source line 180D, and contact plugs 190 (191-196). (The term 'dummy' may indicate a component having a structure and a shape which is the same as or similar to those of other components, but which is merely present as a pattern without possessing the ability to perform one or more functions of the other components. For example, in one embodiment, an electrical signal may not be applied to a 'dummy' component or the 'dummy' component may not be able to perform one or more electrical functions.)

The gate stacks 130 may extend from the cell region CELL to the pad region PAD, and may be spaced apart from one another in a y-direction. A single gate stack 130 may be divided into two separated regions by a pad separating part in the pad region PAD. The pad separating part may include the dummy common source line 180D and a third insulating layer 174 on a side surface thereof. Although the present embodiment illustrates a case in which one end of the pad separating part is positioned at a boundary between the cell region CELL and the pad region PAD, one end of the pad separating part may extend to the cell region CELL in another embodiment, as long as it does not contact the drain pads 160 within the cell region CELL. Alternatively, one end of the pad separating part may be disposed within the pad region PAD.

Adjacent gate stacks 130 may be spaced from each other by first and third distances L1 and L3, which may be identical or similar to each other. Portions of a single gate stack 130 may be spaced apart from each other by a second distance L2, which may be identical or similar to the first and third distances L1 and L3. In another embodiment, distances L1, L2, and L3 may be different.

The common source line 180 and the dummy common source line 180D may extend in parallel in the x-direction. The common source line 180 may continuously extend in the cell region CELL and the pad region PAD. The dummy common source line 180D may only be disposed in the pad region PAD. The common source line 180 may have a width L4 smaller than the first to third distances L1 to L3.

Figure 4A:
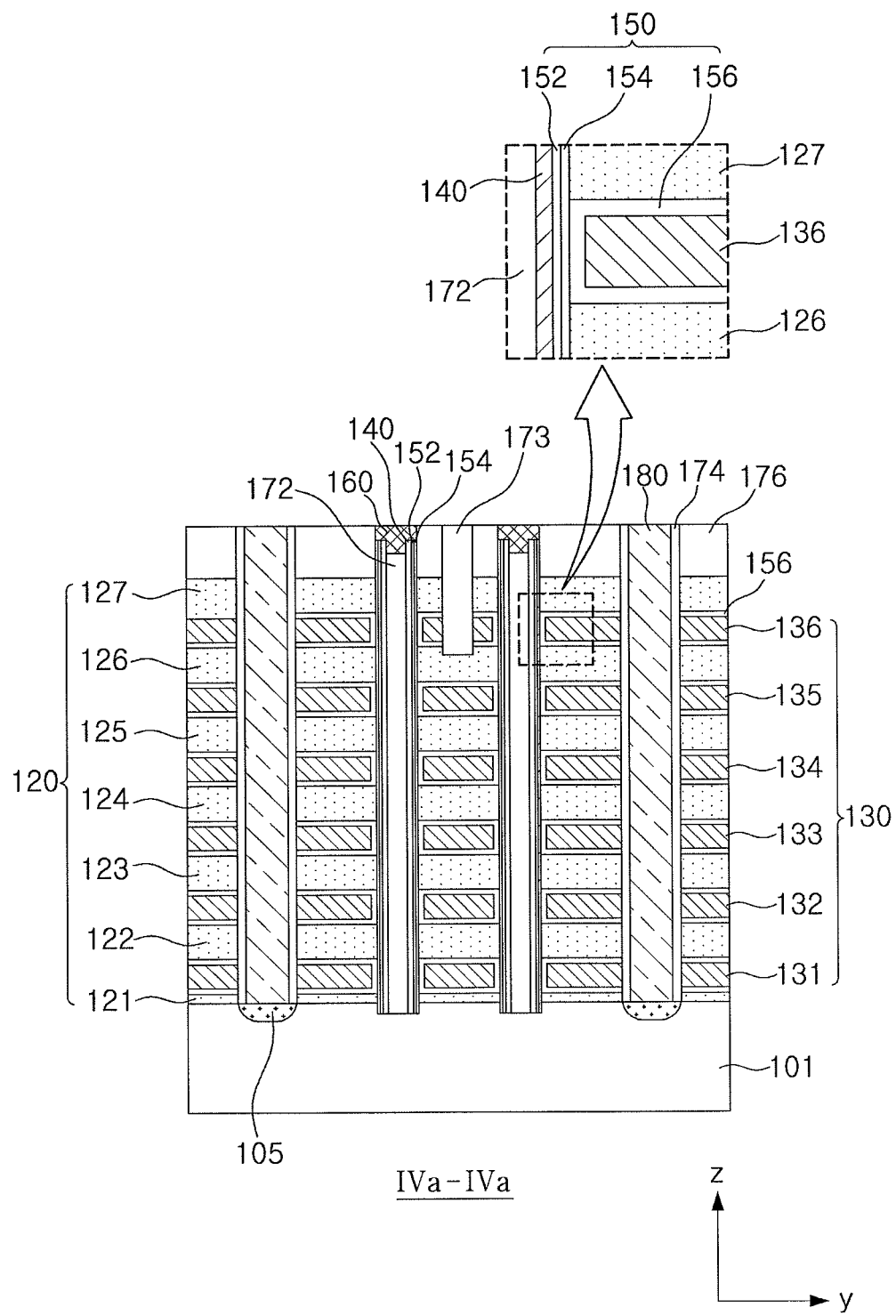
FIGS. 4A to 4D illustrate cross-sectional views of the semiconductor device.

Referring to FIGS. 3 and 4A, the semiconductor device 100 may further include a substrate 101, gate electrode layers 131 to 136 stacked on the substrate 101 and spaced apart from each other in a z-direction to form the gate stacks 130, a plurality of interlayer insulating layers 121 to 127 (120) alternately stacked with the gate electrode layers 131 to 136, and gate dielectric layers 150.

The substrate 101 may have an upper surface extending in the x-direction and the y-direction. The substrate 101 may include a semiconductor material, for example, a group IV semiconductor, a group III-V compound semiconductor, or a group II-VI oxide semiconductor. For example, the Group IV semiconductor may include silicon, germanium, or silicon-germanium. The substrate 101 may be provided, for example, as a bulk wafer or an epitaxial layer.

Referring to FIGS. 3 and 4A, together with FIG. 2, the respective gate electrode layers 131 to 136 may form the ground select transistor GST, the memory cell elements MC1 to MCn, and a gate of the string select transistor SST. Some gate electrode layers 132 to 135 may form the word lines WL1 to WLn to be extended and may be connected to each other in common in a predetermined unit of adjacent memory cell strings arranged in the x-direction and the y-direction.

Figure 4B:
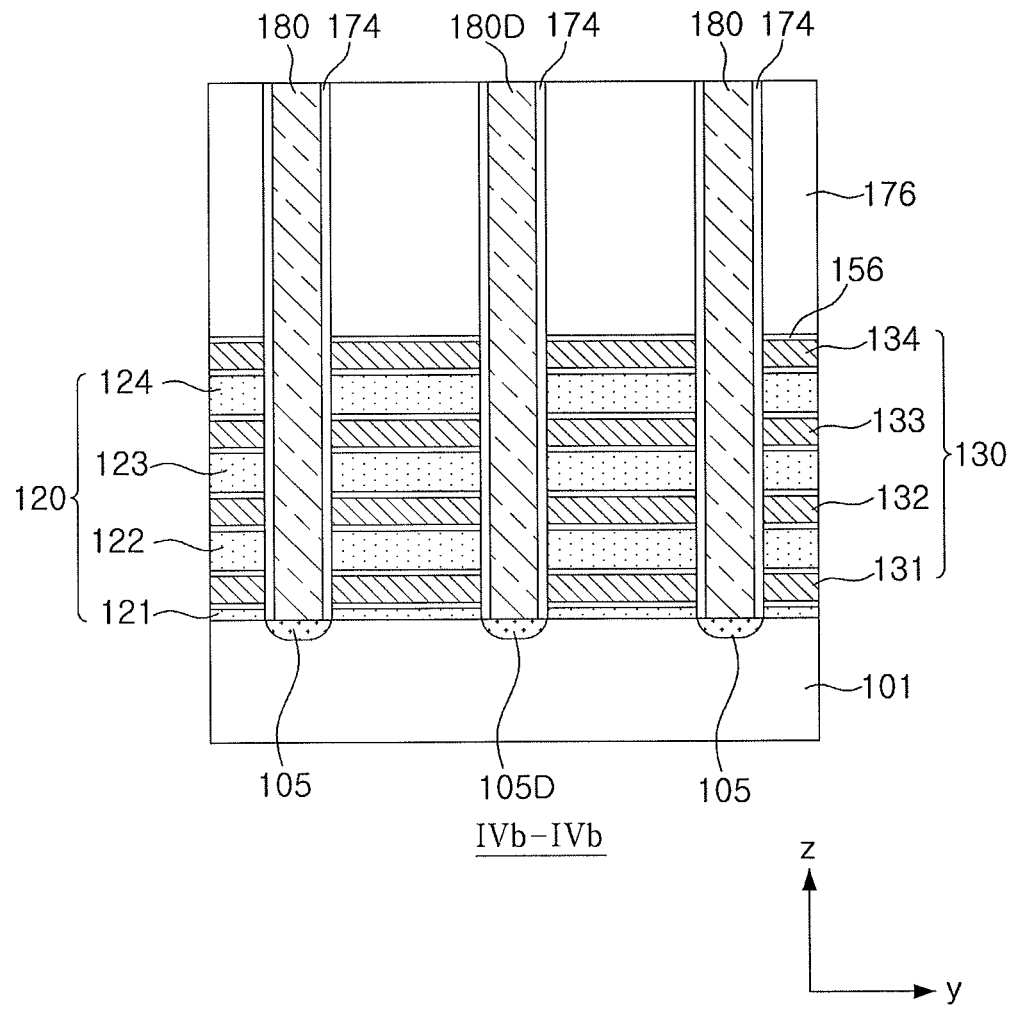
Figure 4C:
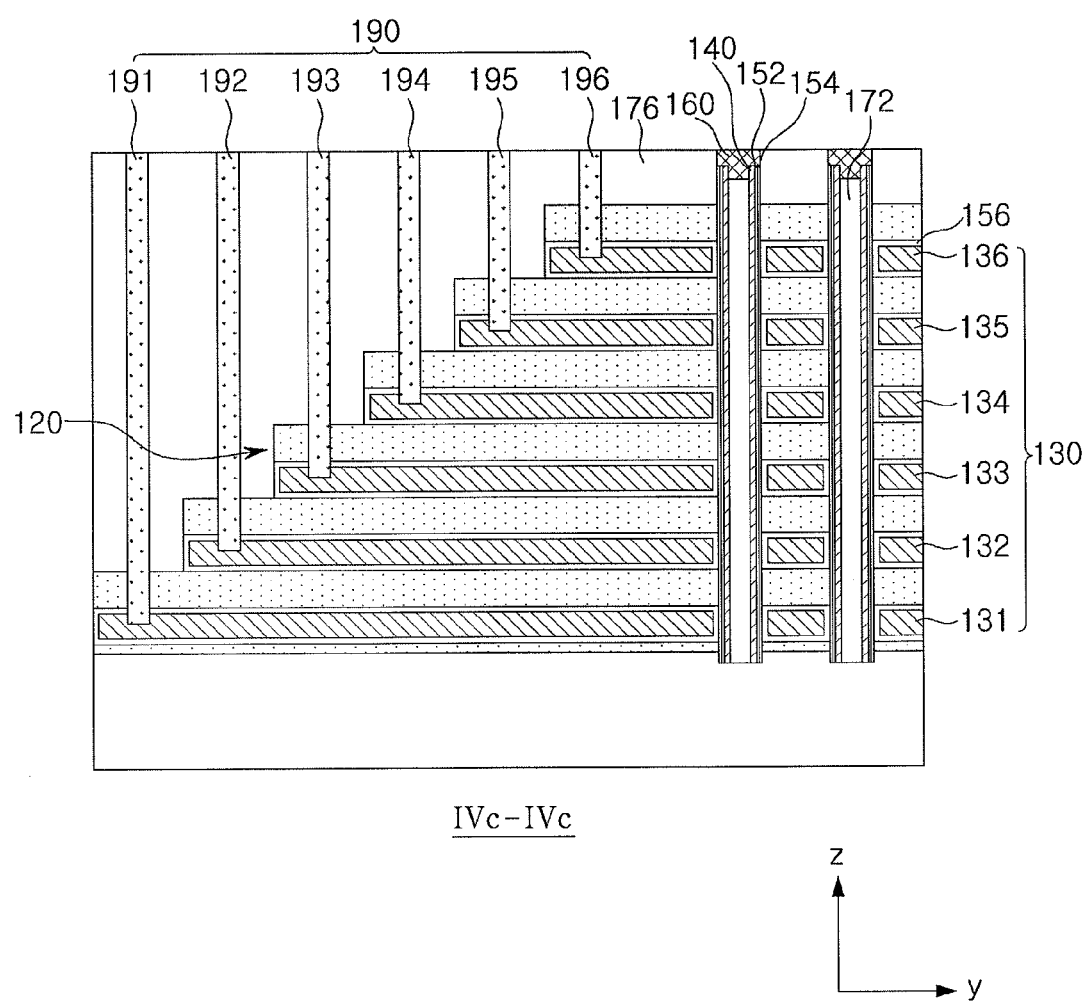
Figure 4D:
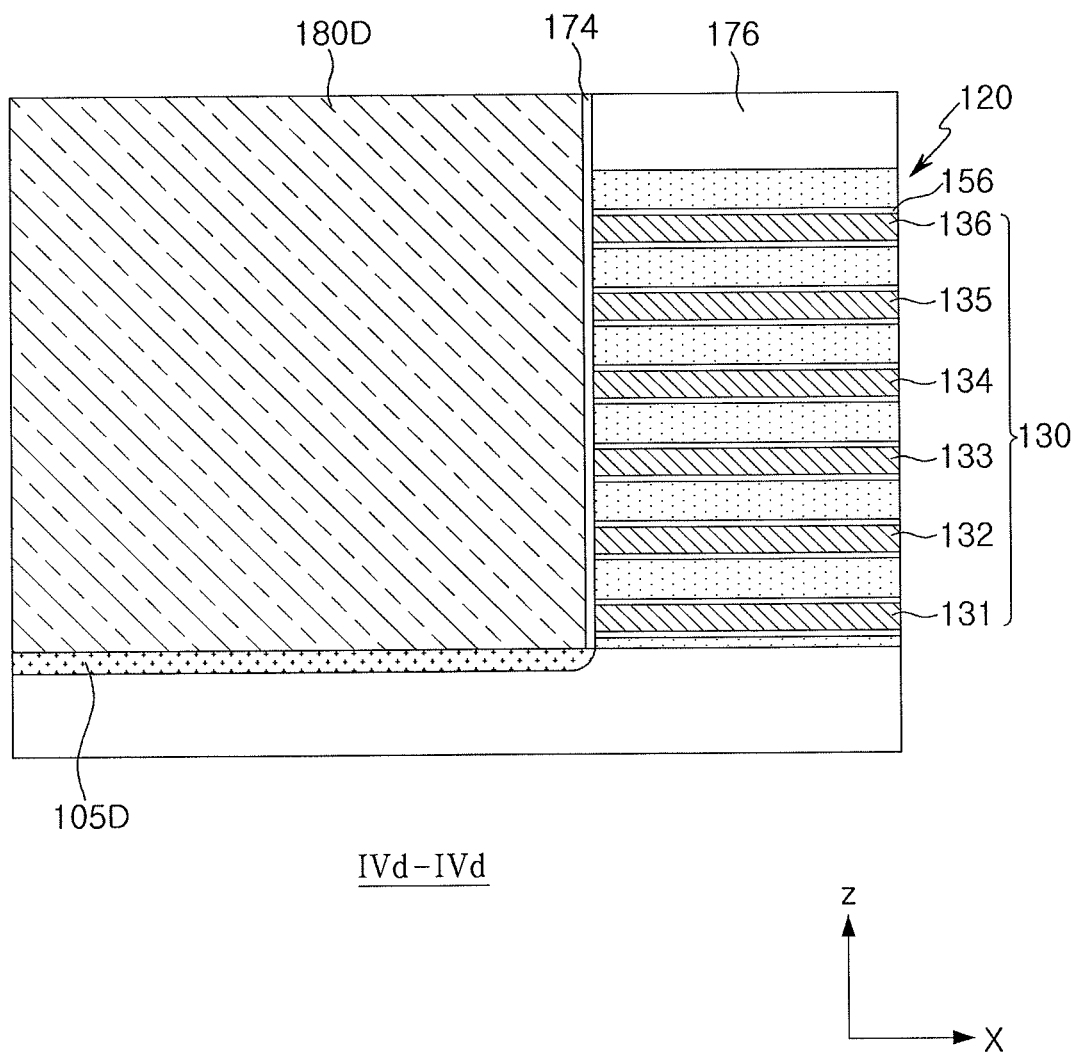

In the embodiment of FIGS. 3 to 4D, a total of six gate electrode layers 131 to 136 are arranged for illustrative purposes. The number of the gate electrode layers 132 to 135 forming the memory cell elements MC1 to MCn may be different depending, for example, on the degree of capacitance of the semiconductor device 100. In one embodiment, the number of the gate electrode layers 132 to 135 forming the memory cell elements MC1 to MCn may be $2^n$ (where n is a natural number).

The gate electrode layer 131 of the ground select transistor GST may extend in the x-direction to form the ground select line GSL. The gate electrode layer 136 of the string select transistor SST may extend in the x-direction to form the string select line SSL. For example, portions of the gate electrode layer 136 of the string select transistor SST may be separated from each other to form different string select lines SSL between the memory cell strings adjacent to each other in the y-direction.

As illustrated in FIG. 3, the gate electrode layer 136 of the string select transistor SST in a single gate stack 130 may be electrically separated by a line separation region SC. In this case, as illustrated in FIG. 4A, a second insulating layer 173 may be disposed within the line separation region SC. In another embodiment, the gate electrode layer 136 of the string select transistor SST may be separated in a different manner between the memory cell strings adjacent to each other in the y-direction.

In one embodiment, the number of gate electrode layers 136 of the string select transistor SST and the number of gate electrode layers 131 of the ground select transistor GST may be two or more. In one embodiment, the gate electrode layers 131 and/or 136 may have structures different from those of the gate electrode layers 132 to 135 of the memory cell elements MC1 to MCn.

The gate electrode layers 131 to 136 may include polysilicon or a metal silicide material. The metal silicide material may be a silicide material of a metal selected from among, for example, cobalt (Co), nickel (Ni), hafnium (Hf), platinum (Pt), tungsten (W) and titanium (Ti). Alternatively, the gate electrode layers 131 to 136 may include a metallic material, for example, tungsten (W). The gate electrode layers 131 to 136 may include diffusion barriers and for example, the diffusion barriers may include at least one of tungsten nitride (WN), tantalum nitride (TaN), and titanium nitride (TiN).

The interlayer insulating layers 121 to 127 (120) may be arranged between the gate electrode layers 131 to 136. The interlayer insulating layers 121 to 127 (120) may be spaced apart from each other in the z-direction and may extend in the x-direction, e.g., in a similar manner to the gate electrode layers 131 to 136. The interlayer insulating layers 121 to 127 (120) may include an insulating material such as a silicon oxide or a silicon nitride.

A plurality of channels 140 may be disposed in the cell region CELL. A single memory cell string may be configured based on each channel 140. The channels 140 may be disposed in a regular pattern while being spaced apart from each other in the x-direction and the y-direction. In another embodiment, the channels 140 may be disposed in a different pattern, e.g., a zigzag pattern in at least one direction.

Each of the channels 140 may have a pillar shape and may extend in the z-direction, a direction perpendicular with respect to the upper surface of the substrate 101. Each of the channels 140 may have a predetermined shape. In one embodiment, each channel 140 have an annular shape to encompass a first insulating layer 172 therein. In another embodiment, each channel 140 has a prismatic shape or a cylindrical shape in which the first insulating layer 172 is not present. In one embodiment, the channels 140 may be provided to be perpendicular with respect to the substrate 101, and the channels 140 may have inclined side surfaces narrowed in a direction toward the substrate 101 in accordance with an increase in an aspect ratio.

The channels 140 may directly contact the substrate 101 on lower surfaces thereof and may be electrically connected thereto. The channels 140 may include a semiconductor material such as polysilicon or single crystal silicon. The semiconductor material may be an undoped material or a material including p-type or n-type impurities.

The gate dielectric layers 150 may be disposed between the gate electrode layers 131 to 136 and the channel 140. As illustrated in an enlarged view in FIG. 4A, the gate dielectric layers 150 may include a tunneling layer 152, a charge storing layer 154, and a blocking layer 156 sequentially stacked from the channel 140.

The tunneling layer 152 may tunnel charges to the charge storing layer, using the Fowler-Nordheim (F-N) tunneling method. The tunneling layer 152 may include, for example, a silicon oxide. The charge storing layer 154 may be a charge trapping layer or a floating gate conductive layer. For example, the charge storing layer 154 may include a dielectric material, quantum dots or nanocrystals. Here, the quantum dots or the nanocrystals may be configured of fine conductor particles, for example, fine metal or semiconductor particles.

The blocking layer 156 may include a high-k dielectric material. Here, the high-k dielectric material refers to a dielectric material having a higher dielectric constant than that of the silicon dioxide. The gate dielectric layers 150 may have a different structure in another embodiment. A more detailed description will be provided with reference to FIGS. 5A and 5B.

The drain pad 160 may cover an upper surface of the first insulating layer 172 and may be electrically connected to the channel 140, at the top of the memory cell string. The drain pad 160 may include, for example, doped polysilicon. The drain pad 160 may serve as a drain region of the string select transistor SST (see FIG. 2) and may be electrically connected to the bit lines BL1 to BLm (see FIG. 2) disposed thereabove.

The dummy pillars 160D and the separation region dummy pillars 165 may support the interlayer insulating layers 121 to 127 (120) during manufacturing the semiconductor device 100, as described with reference to the FIG. 11E.

The dummy pillar 160D may have the same structure as a channel pillar including the drain pad 160 in the cell region CELL and the channel 140 below the drain pad 160, at least some of the gate dielectric layers 150, and the first insulating layer 172. For example, the dummy pillar 160D may have a planar area larger than that of the channel pillar on an x-y plane. The separation region dummy pillar 165 may be disposed in the line separation region SC, and may have the same structure as that of the channel pillar or may only be formed of an insulating material.

Referring to FIGS. 3, 4B and 4D, the common source line 180 and the dummy common source line 180D may upwardly extend from upper surfaces of a doped region 105 and a dummy doped region 105D disposed within the substrate 101, respectively. Each of the common source line 180 and the dummy common source line 180D may be separated from the gate stacks 130 by the third insulating layer 174.

In one embodiment, a single common source line 180 may be disposed per single gate stack 130. The common source line 180 and the dummy common source line 180D may include a conductive material, for example, tungsten (W), aluminum (Al), or copper (Cu). In one embodiment, the dummy common source line 180D and the common source line 180 may be formed in the same processing process, and may have the same shape as or similar to each other. For example, as illustrated in FIG. 4B, the dummy common source line 180D may have the same structure and dispositional relationship with respect to peripheral portions thereof, as those of the common source line 180, in at least one cross-section thereof. As illustrated in FIG. 3, lengths and areas of the dummy common source line 180D and the common source line 180 extended on a plane may be different.

Referring to FIGS. 3 and 4C, the gate stacks 130 may extend at different lengths to form step portions in the pad region PAD. The step portions may be formed in such a manner that a relatively low gate electrode layer (among the gate electrode layers 131 to 136 adjacent to each other) may be longer than a relatively high electrode layer (disposed on an upper portion of the relatively low gate electrode layer) by a predetermined length. By forming step portions as described above, a plurality of the contact plugs 190 may be respectively connected to the individual gate electrode layers 131 to 136. The contact plugs 190 may penetrate through the fourth insulating layer 176 and the respective interlayer insulating layers 121 to 127 (120) by the step portions, and may be connected to the gate electrode layers 131 to 136. The contact plugs 190 may include a conductive material, for example, tungsten (W).

Figure 5A:
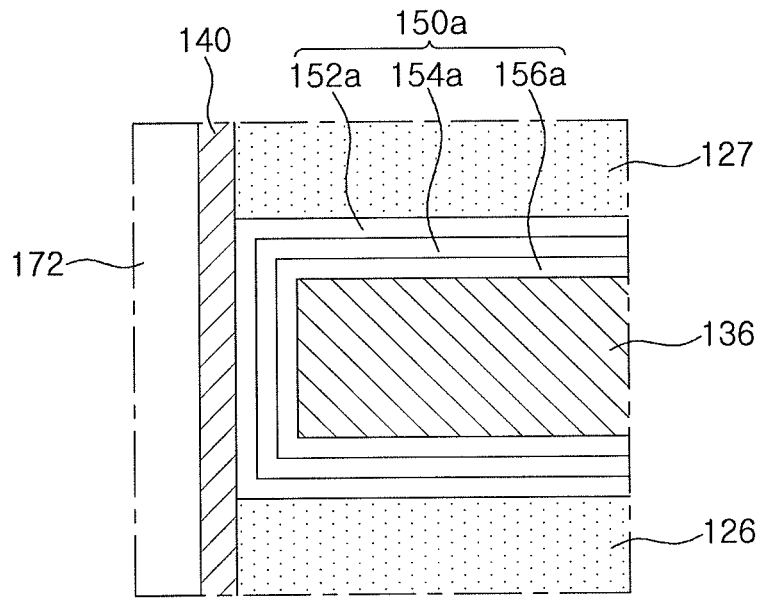
FIGS. 5A and 5B illustrate an example of a gate dielectric layer.
Figure 5B:
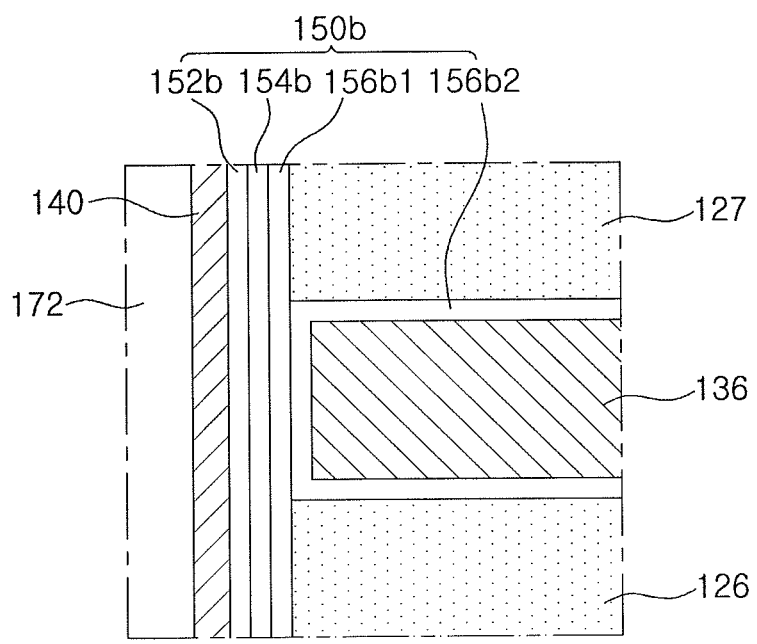

FIGS. 5A and 5B are cross-sectional views illustrating an example of a gate dielectric layer, which, for example, may illustrate regions corresponding to the enlarged view of FIG. 4A.

FIG. 5A illustrates the gate electrode layer 136, gate dielectric layers 150a, the channel 140, and the first insulating layer 172 of the memory cell string. The gate dielectric layers 150a may have a structure which includes a tunneling layer 152a, a charge storing layer 154a, and a blocking layer 156a sequentially stacked from the channel 140. Relative thicknesses of the layers forming the gate dielectric layers 150a are not limited to those illustrated in the drawings and may be different in other embodiments. For example, unlike FIG. 4A, the gate dielectric layers 150a may be disposed such that all of the tunneling layer 152a, the charge storing layer 154a, and the blocking layer 156a encompass the gate electrode layer 136.

The tunneling layer 152 may include at least one of silicon dioxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), or zirconium oxide ($ZrO_2$).

The charge storing layer 154 may be a charge trapping layer or a floating gate conductive layer. When the charge storing layer 154 is a floating gate conductive layer, the charge storing layer 154 may be formed through deposition of polysilicon by performing chemical vapor deposition (CVD), for example, low pressure CVD (LPCVD). When the charge storing layer 154 is a charge trapping layer, the charge storing layer 154 may include at least one material from among silicon dioxide (SiO$_2$), silicon nitride (Si$_3$N$_4$), silicon oxynitride (SiON), hafnium oxide (HfO$_2$), zirconium oxide (ZrO$_2$), tantalum oxide (Ta$_2$O$_3$), titanium oxide (TiO$_2$), hafnium aluminum oxide (HfAl$_x$O$_y$), hafnium tantalum oxide (HfTa$_x$O$_y$), hafnium silicon oxide (HfSi$_x$O$_y$), aluminum nitride (Al$_x$N$_y$), or aluminum gallium nitride (AlGa$_x$N$_y$).

The blocking layer 156a may include silicon dioxide (SiO$_2$), silicon nitride (Si$_3$N$_4$), silicon oxynitride (SiON), or a high-k dielectric material. The high-k dielectric material may be at least one of aluminum oxide (Al$_2$O$_3$), tantalum oxide (Ta$_2$O$_3$), titanium oxide (TiO$_2$), yttrium oxide (Y$_2$O$_3$), zirconium oxide (ZrO$_2$), zirconium silicon oxide (ZrSi$_x$O$_y$), hafnium oxide (HfO$_2$), hafnium silicon oxide (HfSi$_x$O$_y$), lanthanum oxide (La$_2$O$_3$), lanthanum aluminum oxide (LaAl$_x$O$_y$), lanthanum hafnium oxide (LaHf$_x$O$_y$), hafnium aluminum oxide (HfAl$_x$O$_y$), or praseodymium oxide (Pr$_2$O$_3$).

FIG. 5B illustrates the gate electrode layer 136, gate dielectric layers 150b, the channel 140, and the first insulating layer 172 of the memory cell string. The gate dielectric layers 150b may have a structure which includes a tunneling layer 152b, a charge storing layer 154b, and blocking layers 156b1 and 156b2 sequentially stacked from the channel 140.

For example, unlike FIGS. 4A and 5A, in the gate dielectric layers 150b, the blocking layers 156b1 and 156b2 may include two layers, In this case, a first blocking layer 156b1 may be vertically extended, similarly to the channel 140, and a second blocking layer 156b2 may be disposed to encompass the gate electrode layer 136. For example, the first blocking layer 156b1 may be a relatively low-k dielectric layer, and the second blocking layer 156b2 may be a relatively high-k dielectric layer. In this case, the first blocking layer 156b1 may be disposed on a side surface of the second blocking layer 156b2, whereby an energy band such as a barrier height may be controlled to allow for improvements in characteristics of the semiconductor device, for example, erase characteristics.

Figure 6:
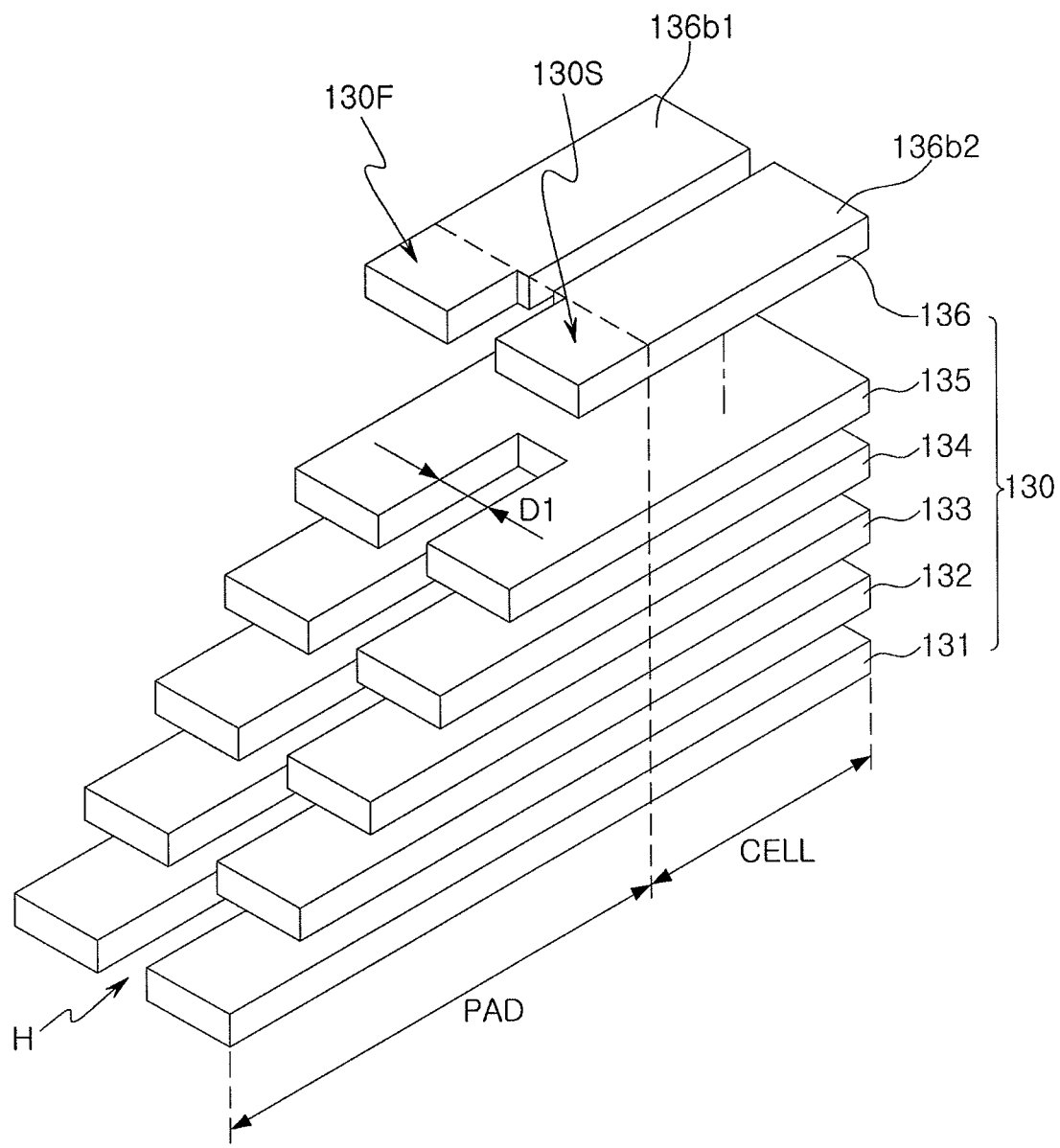
FIG. 6 illustrates an example of a gate stack.

FIG. 6 illustrates an example of a gate stack, which for example, may correspond to gate stacks 130. Referring to FIG. 6, the gate stacks 130 may include the gate electrode layers 131 to 136. The gate electrode layers 131 to 136 may be separated into first and second regions 130F and 130S in the pad region PAD.

The uppermost gate electrode layer 136 may be separated into first and second regions 136b1 and 136b2 and spaced apart from each other in both of the cell region CELL and the pad region PAD. The gate electrode layers 131 to 135 on a lower portion of the uppermost gate electrode layer 136 may be respectively formed as single layers having single regions in the cell region CELL, but may be separated into the first and second regions 130F and 130S in the pad region PAD. A pad separation region H may be formed between the first and second regions 130F and 130S. The pad separating part including the dummy common source line 180D described above with reference to FIG. 3 may be disposed in the pad separation region H.

A width D1 of the pad separation region H may be selected within a predetermined range (for example, 10% to 30%) of the overall width of the gate stacks 130. When the width D1 of the pad separation region H is relatively large, it may be difficult to secure space to have the contact plugs 190 (see FIG. 3) formed therein and to secure structural stability. When the width D1 of the pad separation region H is relatively narrow, a difference in volumes of the gate electrode layers 131 to 136 between the cell region CELL and the pad region PAD due to the pad separation region H may not be reduced to a predetermined range or less. An example will be provided with reference to FIG. 11G.

The width D1 of the pad separation region H may be greater than a distance by which the first and second regions 136b1 and 136b2 of the uppermost gate electrode layer 136 are spaced apart from each other. In another embodiment, the width D1 may be equal to or less than this distance. In addition, in one embodiment, depending on a disposition shape of the channel 140 (see FIG. 4A), the uppermost gate electrode layer 136 may also be formed as a single layer having a single region in the cell region CELL.

Figure 7A:
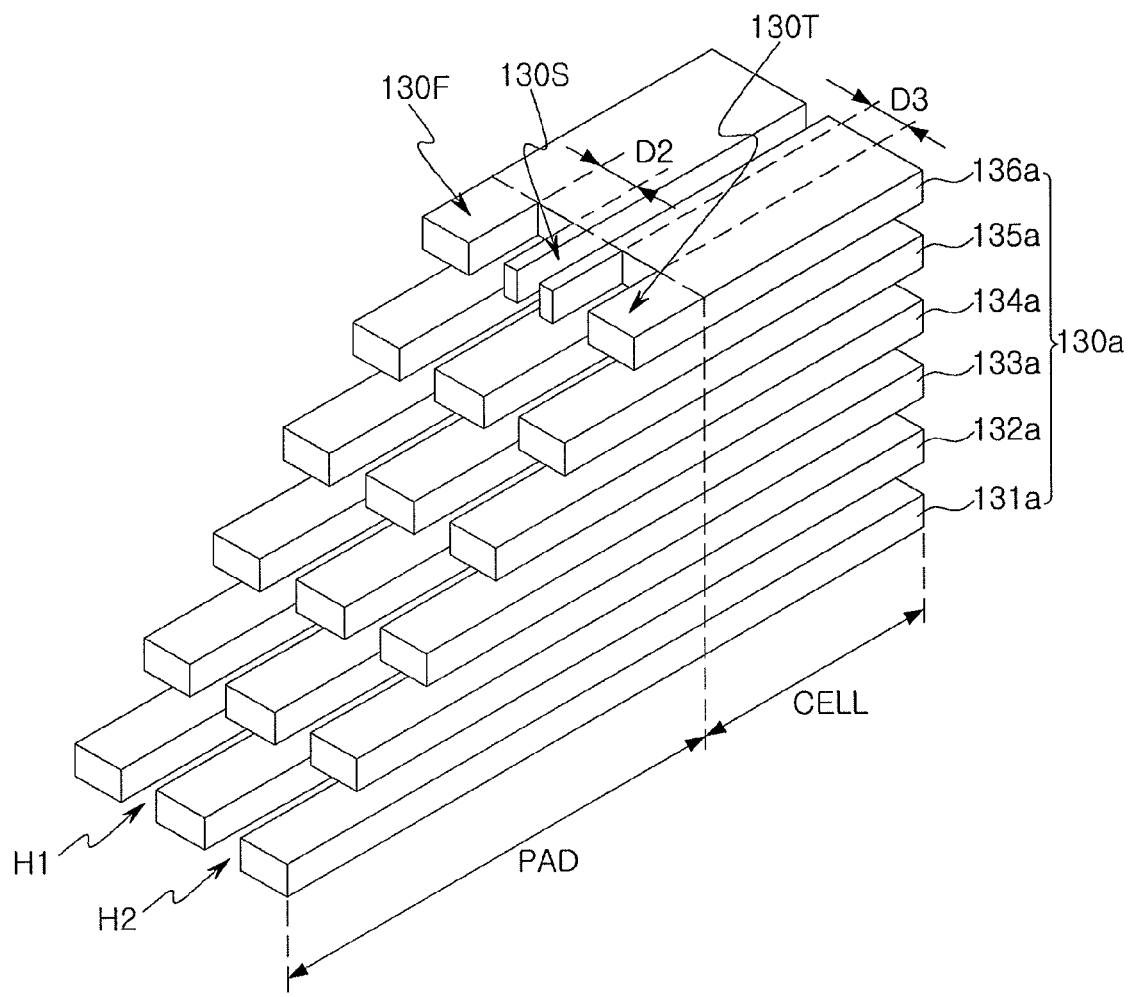
FIGS. 7A and 7B illustrate an example of a gate stack.
Figure 7B:
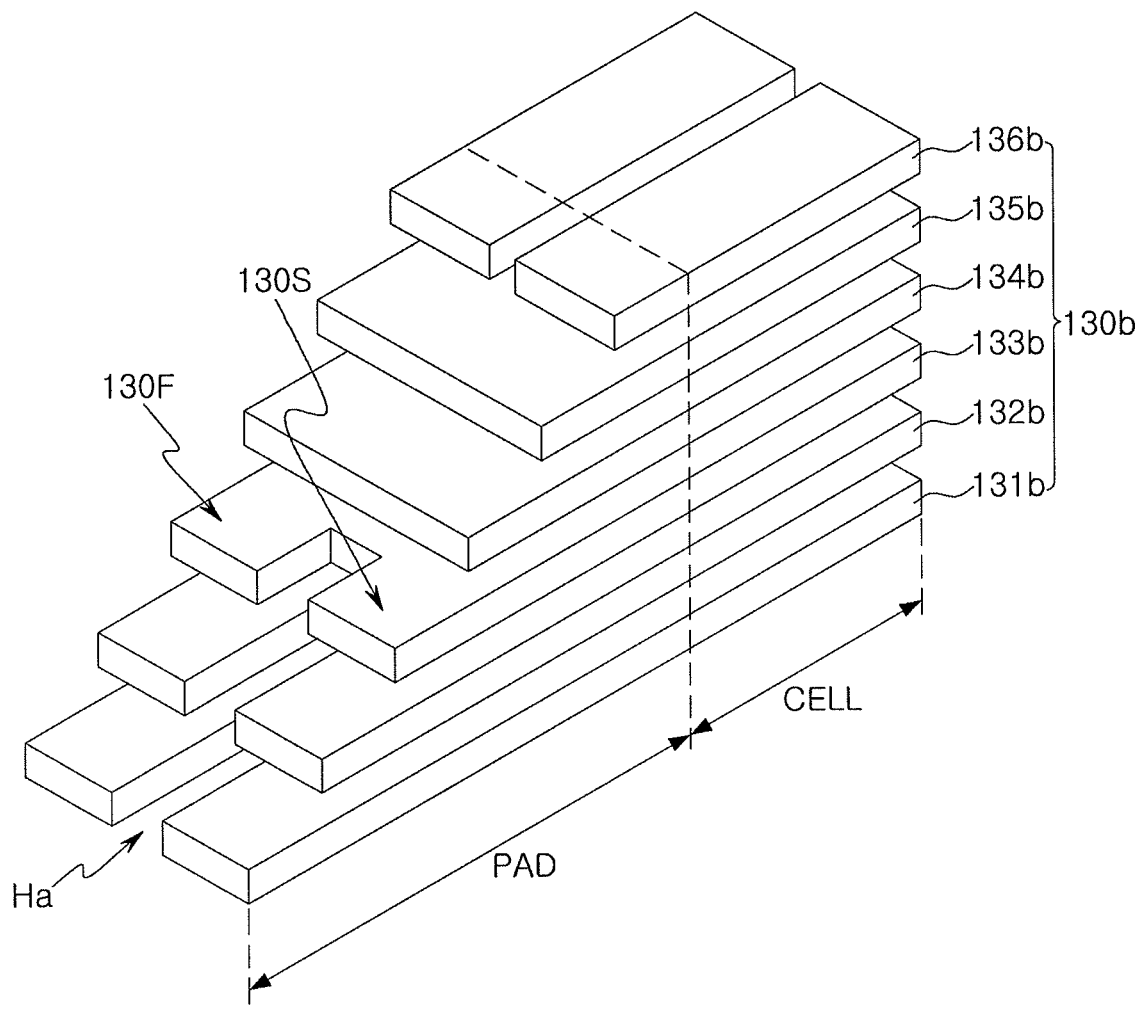

FIGS. 7A and 7B illustrate another example of gate stacks 130a. Referring to FIG. 7A, gate stacks 130a include gate electrode layers 131a to 136a. The gate electrode layers 131a to 136a may be separated into first to third regions 130F, 130S, and 130T in the pad region PAD. Pad separation regions H1 and H2 may be formed between the first to third regions 130F, 130S, and 130T. In each of the pad separation regions H1 and H2, the pad separating part including the dummy common source line 180D described above with reference to FIG. 3 may be disposed.

The uppermost gate electrode layer 136a may be divided into two regions in the cell region CELL and may be separated by the pad separation regions H1 and H2 to be divided into four regions in the pad region PAD. The reason for this is that end portions of the pad separation regions H1 and H2 are positioned within the uppermost gate electrode layer 136a. In a similar manner to the embodiment of FIG. 6, the gate electrode layers 131a to 135a disposed on a lower portion of the uppermost gate electrode layer 136a may be respectively formed as single layers having single regions in the cell region CELL, but may be separated into the first to third regions 130F, 130S, and 130T in the pad region PAD.

For example, widths D2 and D3 of the pad separation regions H1 and H2 may be identical to or different from each other. Each width D2 or D3 of the pad separation region H1 or H2 may be less than the width D1 of the pad separation region H in the embodiment of FIG. 6.

The number of regions formed by separating the gate stacks 130a in the pad region PAD may differ for different embodiments. For example, the gate stacks 130a may be separated into at least two regions. Further, the end portions of the pad separation regions H1 and H2 may not be positioned within the uppermost gate electrode layer 136a.

Referring to FIG. 7B, gate stacks 130b may include gate electrode layers 131b to 136b. The gate electrode layers 131b to 136b may be separated into first and second regions 130F and 130S in the pad region PAD. A pad separation region Ha may be formed between the first and second regions 130F and 130S. In this manner, the pad separation region Ha may only be formed in some of the gate electrode layers 131b to 136b. Accordingly, an end portion of the pad separation region Ha may be positioned within the pad region PAD.

The uppermost gate electrode layer 136b may be divided into two regions in both of the cell region CELL and the pad region PAD. Some gate electrode layers 134b and 135b disposed on a lower portion of the uppermost gate electrode layer 136b may be formed as single layers having single regions in both of the cell region CELL and the pad region PAD. Other gate electrode layers 131b, 132b and 133b disposed on a lower portion of the uppermost gate electrode layer 136b may be formed as single layers having single regions in the cell region CELL and a portion of the pad region PAD, but may be separated into the first and second regions 130F and 130S in another portion of the pad region PAD.

The number of the gate electrode layers 131b to 136b in which the pad separation region Ha is formed may differ for different embodiments. Also, the gate electrode layers 131b to 136b may be sequentially selected from the lowermost gate electrode layer 131b.

Figure 8:
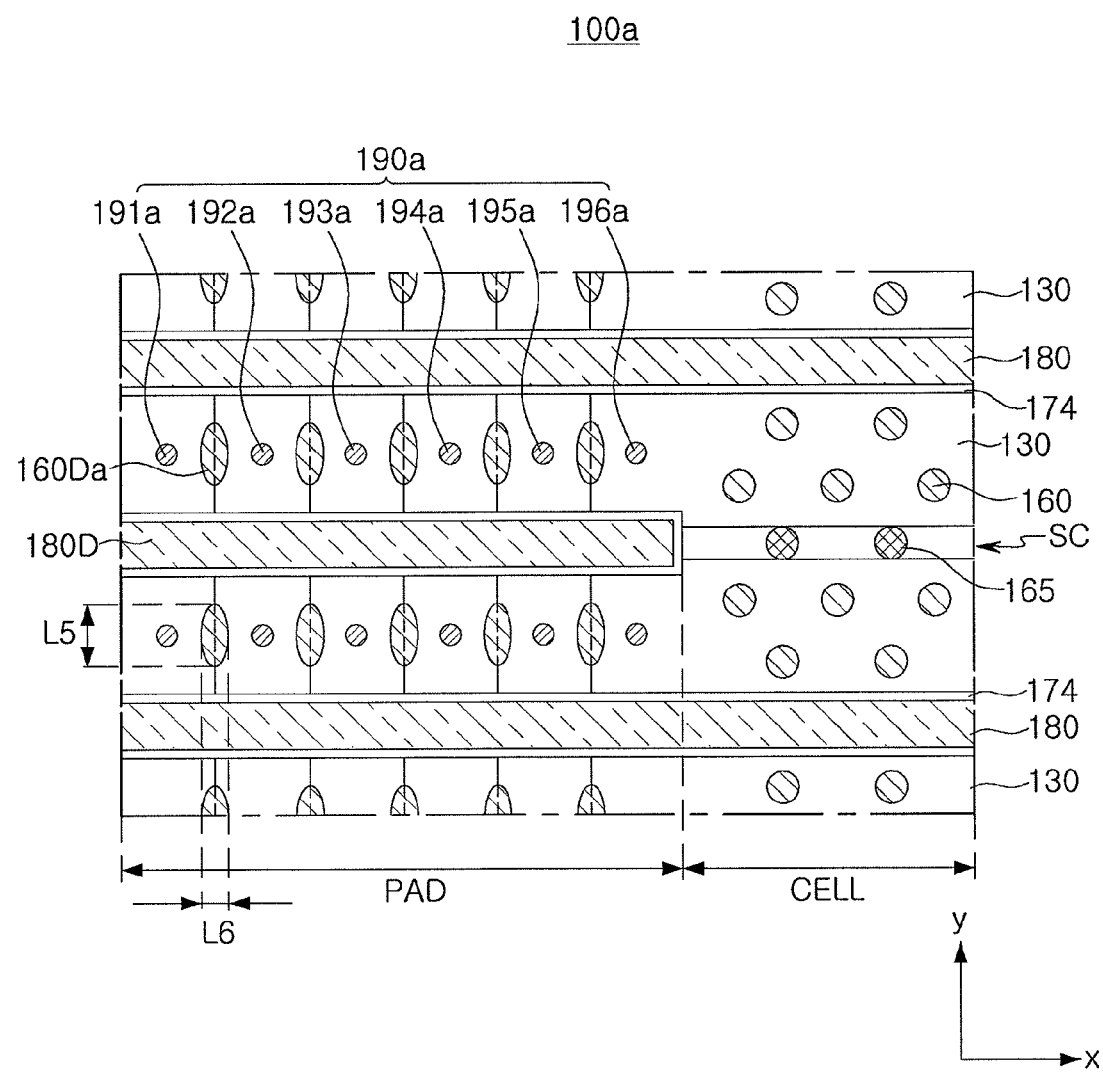
FIG. 8 illustrates another embodiment of a semiconductor device.

FIG. 8 illustrates another embodiment of a semiconductor device 100a which includes the gate stacks 130, the drain pads 160, dummy pillars 160Da, the separation region dummy pillars 165, the common source line 180, the dummy common source line 180D, and contact plugs 190a(191a to 196a).

Referring to FIG. 8, the dummy pillars 160Da and the contact plugs 190a in the pad region PAD may be disposed in a different manner compared to the embodiment of FIG. 3. For example, the contact plugs 190a are disposed on a line passing through a central portion in a y-direction in one region of the gate stacks 130 separated by the dummy common source line 180D. Further, the dummy pillars 160Da have elliptical shapes extending in a direction away from the contact plugs 190a. For example, the dummy pillars 160Da may have elliptical shapes in which a length L5 of a major axis in the y-direction is greater than a length L6 of a minor axis in the x-direction. Due to the shapes as described above, the dummy pillars 160Da may have a predetermined size (e.g., greater than or equal to a reference size) in order to sufficiently support the interlayer insulating layers 120 during a process of removing sacrificial layers 110 (to be described with reference to FIG. 11E), while at the same time securing spaces between the dummy pillars 160Da and the contact plugs 190a to thereby prevent electrical short circuits. In another embodiment, the dummy pillars 160Da may have a different shape, e.g., a polygonal shape, a rectangular shape, etc.

Figure 9:
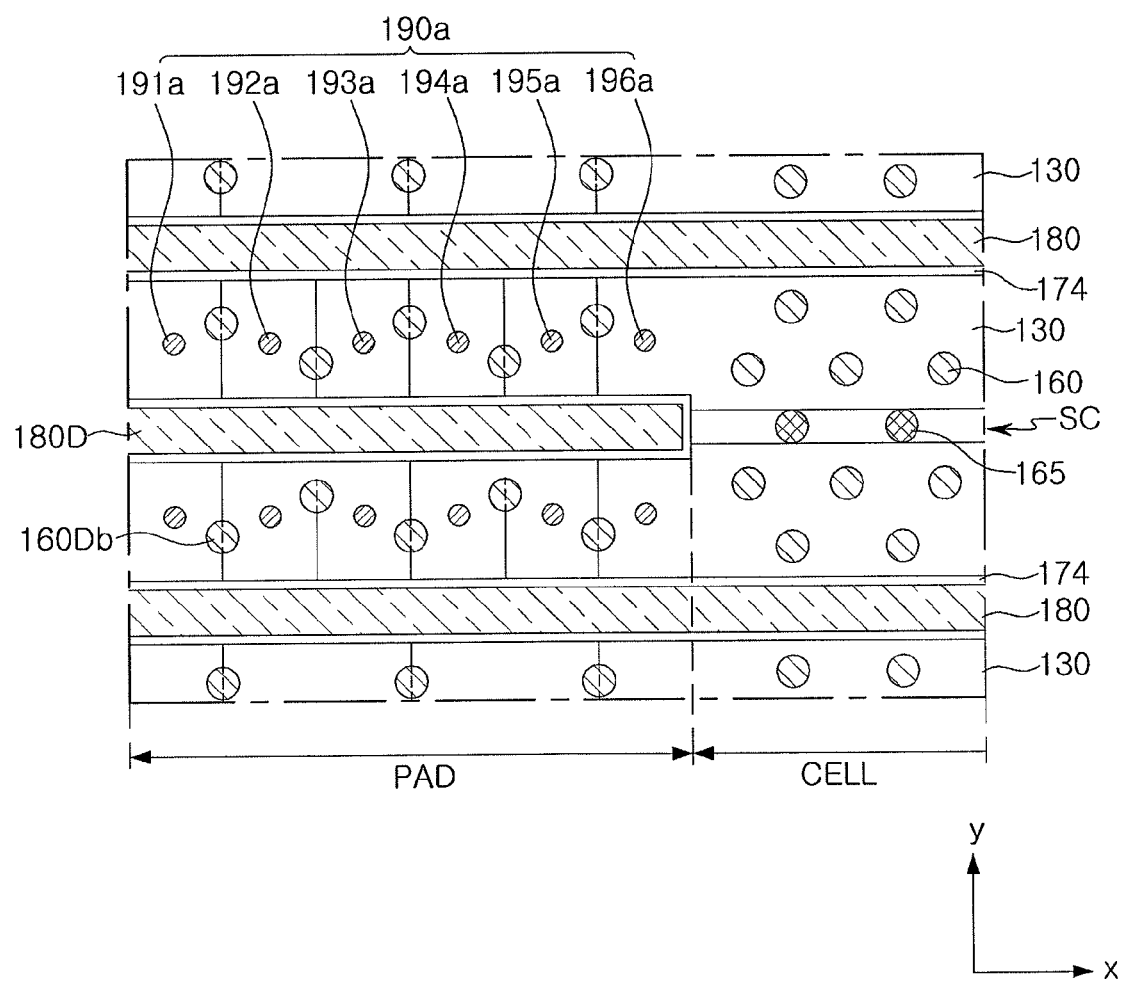
FIG. 9 illustrates another embodiment of a semiconductor device.

FIG. 9 illustrates another embodiment of a semiconductor device 100b which includes the gate stacks 130, the drain pads 160, the dummy pillars 160Db, the separation region dummy pillars 165, the common source line 180, the dummy common source line 180D, and the contact plugs 190a.

Referring to FIG. 9, the dummy pillars 160Db and the contact plugs 190a in the pad region PAD may be different compared to the embodiment of FIG. 3. For example, the dummy pillars 160Db may not be disposed in a straight line in the x-direction and may be placed between the respective contact plugs 190a, in different lines in the y-direction. In addition, the dummy pillars 160Db may have diameters identical or similar to those of channel pillars below the drain pads 160.

The shapes and/or dispositions of the dummy pillars 160Db and the contact plugs 190a may differ in different embodiments, for example, taking into consideration one or more of a degree of density of the dummy pillars 160Db and the channel pillars below the drain pads 160 in the cell region CELL and the pad region PAD, a length and a width of step portions between the gate stacks 130 formed in the pad region PAD, or the like.

Figure 10A:
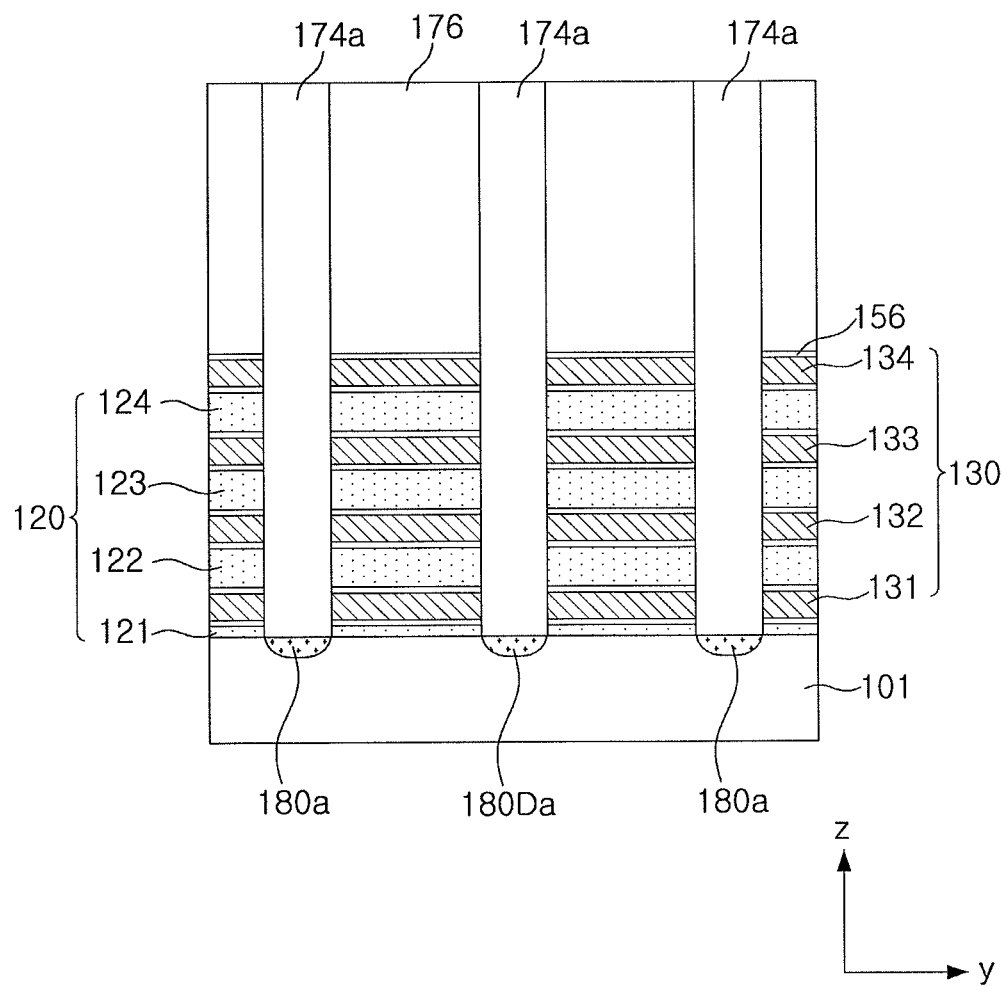
FIGS. 10A and 10B illustrate another embodiment of a semiconductor device.
Figure 10B:
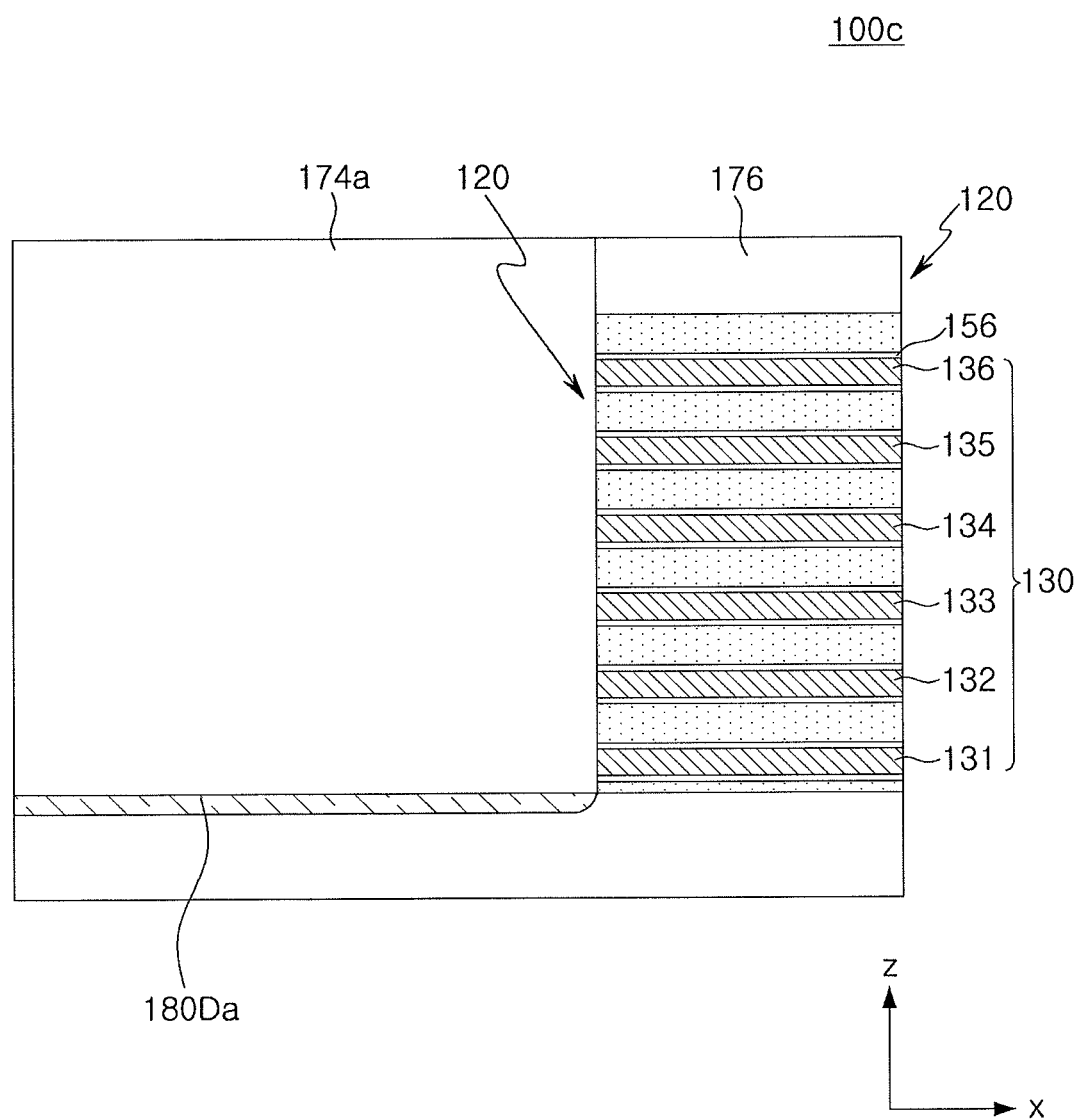

FIGS. 10A and 10B illustrate cross-sectional view of another embodiment of a semiconductor device 100c. The cross-sectional views correspond to FIGS. 4B and 4D, respectively.

Referring to FIGS. 10A and 10B, unlike the embodiment of FIGS. 4A to 4D, in the semiconductor device 100c, a common source line 180a and a dummy common source line 180Da may not disposed on the substrate 101 and may be disposed adjacent to the upper surface of the substrate 101 extending in the x-direction. The common source line 180a and the dummy common source line 180Da may be an impurity region or a doped region including impurities. A third insulating layer 174a may be disposed on the common source line 180a and the dummy common source line 180Da. The dummy common source line 180Da and the third insulating layer 174a may form a pad separation region and separate a single gate stack 130 into two regions in the pad region PAD (see FIG. 3).

When the common source line 180a has a conductivity type opposite to that of the substrate 101, the common source line 180a may serve as source regions of the adjacent ground select transistors GST (see FIG. 2). When the common source line 180a has a conductivity type the same as that of the substrate 101, the common source line 180a may function as a pocket P well contact electrode for an erase operation of block units of memory cell strings. In this case, data stored in all memory cells in a corresponding memory cell block of the substrate 101 may be erased by applying a high voltage to the substrate 101 through the pocket P well contact electrode.

In one embodiment, the dummy common source line 180Da and the common source line 180a may be formed in the same process and may have the same structure in at least one cross-section thereof.

Figure 11A:
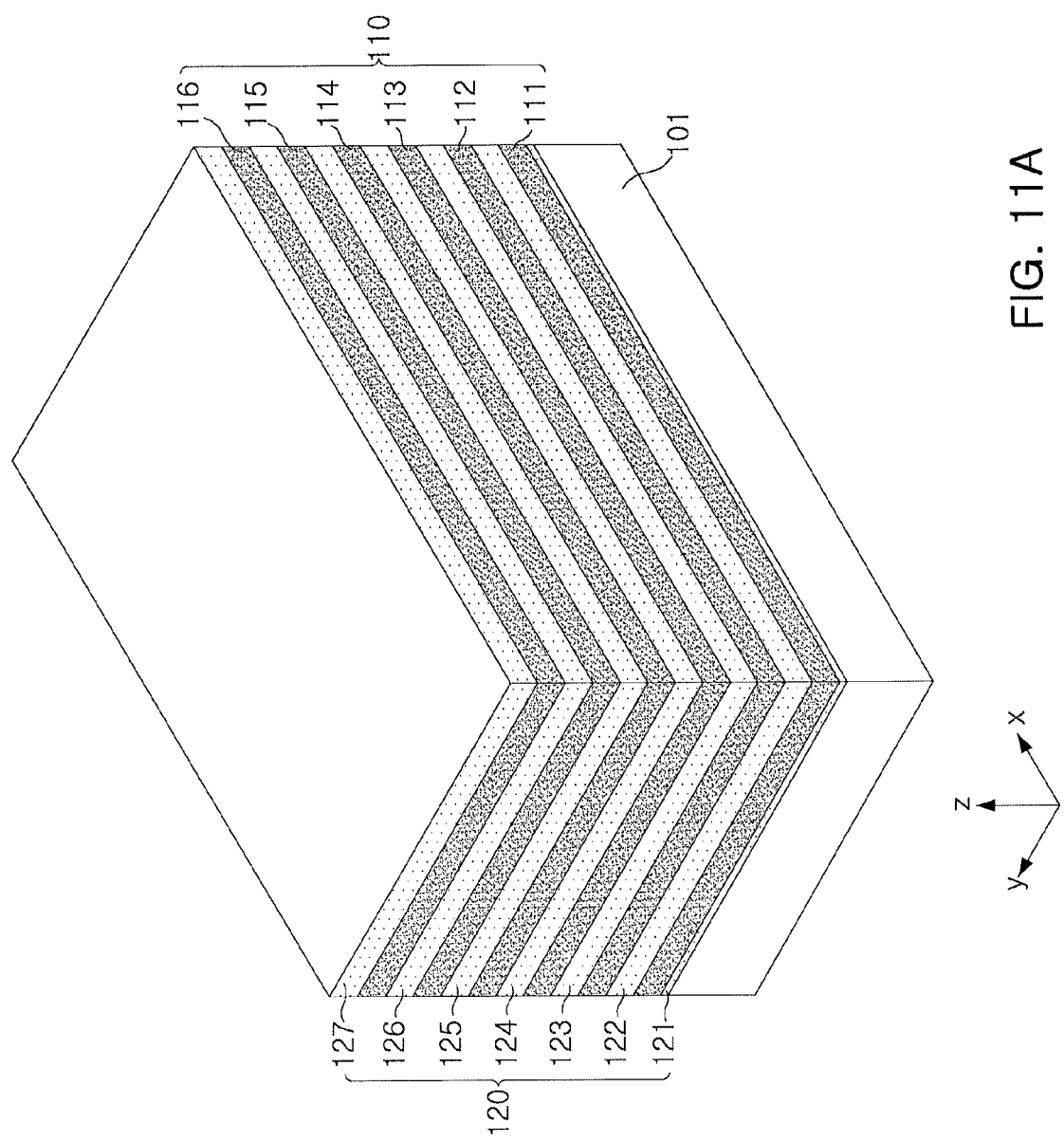
FIGS. 11A to 11I illustrate a method for manufacturing a semiconductor device.

FIGS. 11A through 11I illustrate operations included in one embodiment of a method for manufacturing a semiconductor device. Referring to FIG. 11A, the sacrificial layers 111 to 116 (110) and the interlayer insulating layers 121 to 127 (120) may be alternately stacked on the substrate 101. The interlayer insulating layers 120 and the sacrificial layers 110 may be alternately stacked on the substrate 101, for example, beginning with the first interlayer insulating layer 121.

The sacrificial layers 110 may be formed of an etchable material having etch selectivity with respect to the interlayer insulating layers 120. For example, the sacrificial layers 110 may be formed of a material capable of being etched while significantly decreasing etching of the interlayer insulating layers 120 during a process of etching the sacrificial layers 110. Such an etch selectivity or an etch selection ratio may be quantitatively represented by a ratio of an etch rate of the sacrificial layers 110 to an etch rate of the interlayer insulating layers 120. For example, the interlayer insulating layer 120 may be at least one of a silicon oxide layer and a silicon nitride layer, and the sacrificial layer 110 may be formed of a material different from that of the interlayer insulating layer 120 selected from a group consisting of a silicon layer, a silicon oxide layer, silicon carbide and a silicon nitride layer.

The thicknesses of the interlayer insulating layers 120 may or may not be the same as each other. In one embodiment, the lowermost interlayer insulating layer 121 of the interlayer insulating layers 120 may be relatively thinly formed, and the uppermost interlayer insulating layer 127 thereof may be relatively thickly formed. The number of layers configuring the interlayer insulating layers 120 and the sacrificial layers 110 may be different in different embodiments.

Figure 11B:
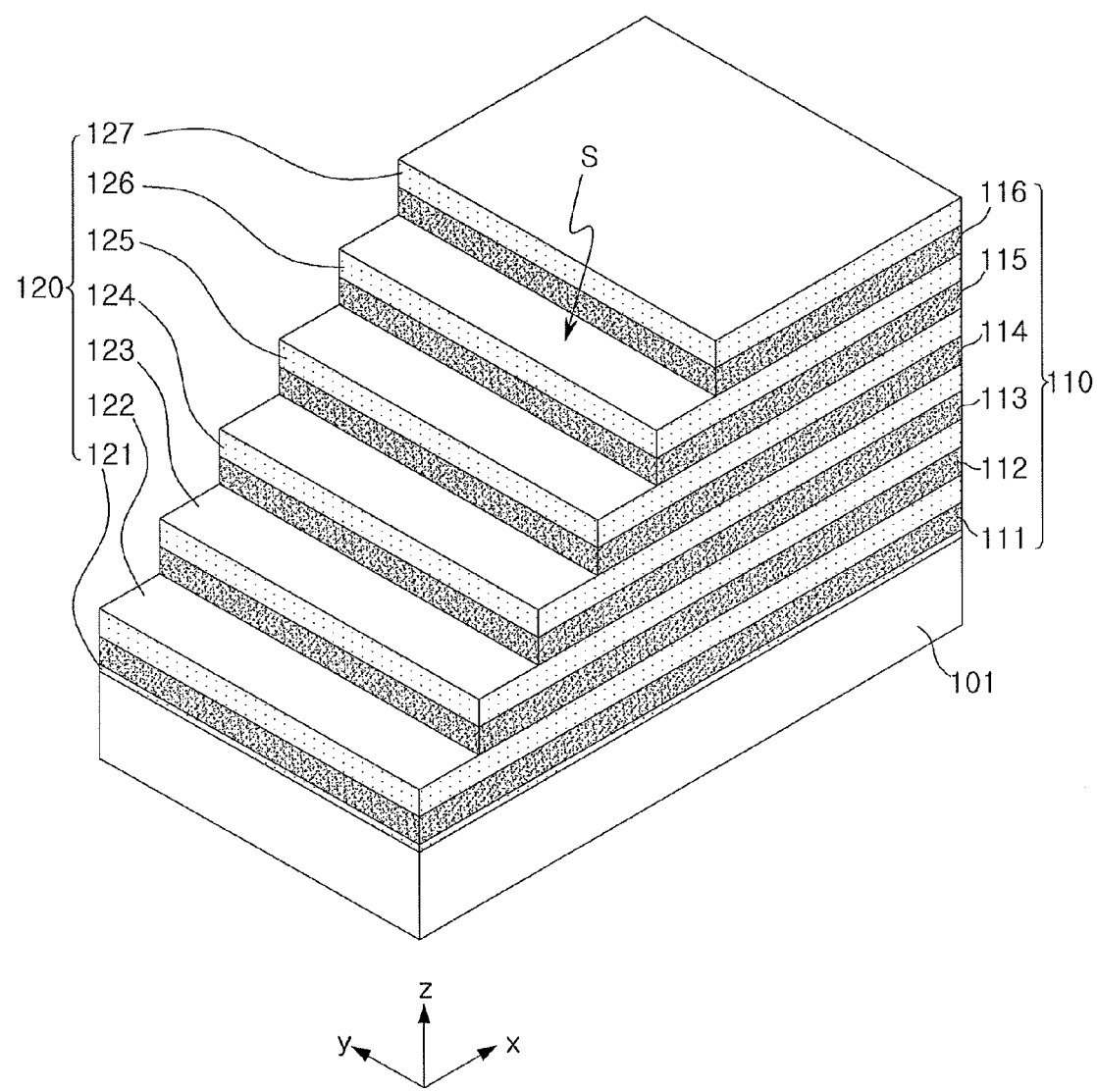

Referring to FIG. 11B, the sacrificial layers 110 and the interlayer insulating layers 120 alternately stacked on the substrate 101 may be etched in order to prepare the pad region having step portions S formed in a stepped manner.

In order to form the step portions S between the sacrificial layers 110 and the interlayer insulating layers 120 adjacent to each other in the z-direction, a mask layer may be formed on a stack of the sacrificial layers 110 and the interlayer insulating layers 120 on the substrate 101, and exposed portions of the sacrificial layers 110 and the interlayer insulating layers 120 exposed by the mask layer may be etched. While the mask layer is trimmed at a predetermined length, a process of etching the sacrificial layers 110 and the interlayer insulating layers 120 exposed by the mask layer is repeated multiple times, thereby forming the step portions S formed in a stepped manner.

In one embodiment, a single sacrificial layer 110 and a single interlayer insulating layer 120 may form a pair of layers and may extend to have the same length in the x-direction.

Figure 11C:
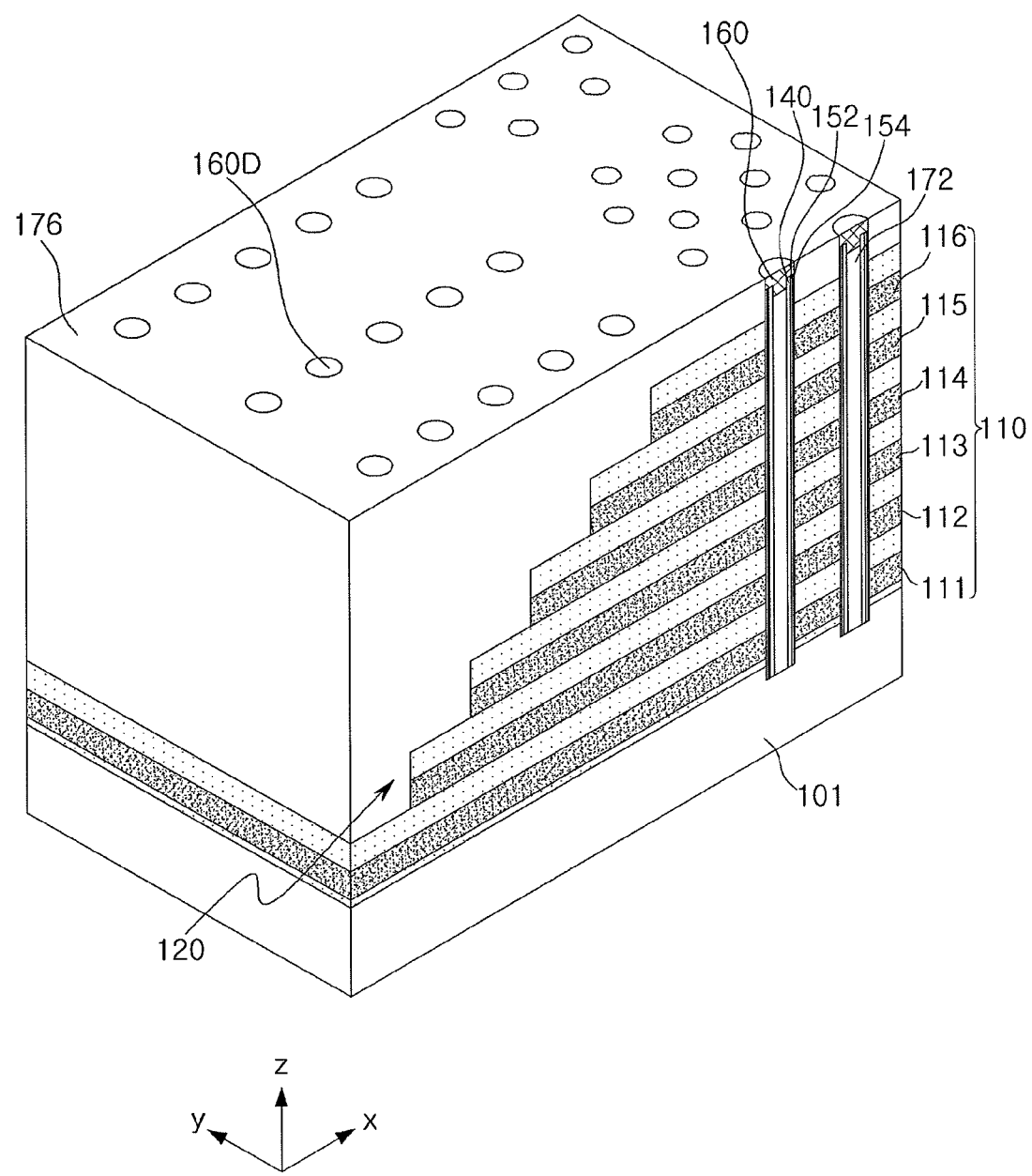

Referring to FIG. 11C, after the fourth insulating layer 176 covering the sacrificial layers 110 and the interlayer insulating layers 120 is formed, the tunneling layer 152, the charge storing layer 154, and the channel 140, are formed to penetrate through the sacrificial layers 110 and the interlayer insulating layers 120. The drain pad 160 may be further formed on the channel 140.

First, the fourth insulating layer 176 may be formed to cover the pad region. In addition, in a non-illustrated region, the fourth insulating layer 176 may be disposed to cover one end of the lowermost sacrificial layer 111 extended in the x-direction.

Next, openings in the form of holes penetrating through the sacrificial layers 110 and the interlayer insulating layers 120 may be formed. The openings may extend to the substrate 101 in the z-direction. The openings may be formed, for example, by anisotropically etching the sacrificial layers 110 and the interlayer insulating layers 120. Since a stacked structure including different two types of layers is etched, side walls of the openings may not be perpendicular with respect to the upper surface of the substrate 101. For example, widths of the openings may be reduced in a direction toward the upper surface of the substrate 101. The openings may be over-etched and the upper surface of the substrate 101 may be recessed at a predetermined depth. In one embodiment, an epitaxial layer having a predetermined height may be formed on a portion of the substrate 101 below the channel 140, for example, using a selective epitaxial growth (SEG) process.

The tunneling layer 152, the charge storing layer 154, and portions of the gate dielectric layers 150 may be formed and the channel 140 may be formed within each of the openings. Then, the opening may be filled with the first insulating layer 172, and the drain pad 160 may be formed on the first insulating layer 172.

The dummy pillars 160D may be formed in the step portions S between the sacrificial layers 110 and the interlayer insulating layers 120 so as to penetrate therethrough. The dummy pillars 160D may be formed using the same process used to form the channel pillars each including the channel 140, the tunneling layer 152, the charge storing layer 154, and the drain pad 160. The dummy pillars 160D may have the same structure as that of the channel pillars. The second insulating layer 173 of FIG. 4A, or a structure corresponding thereto, may be formed in this process.

Figure 11D:
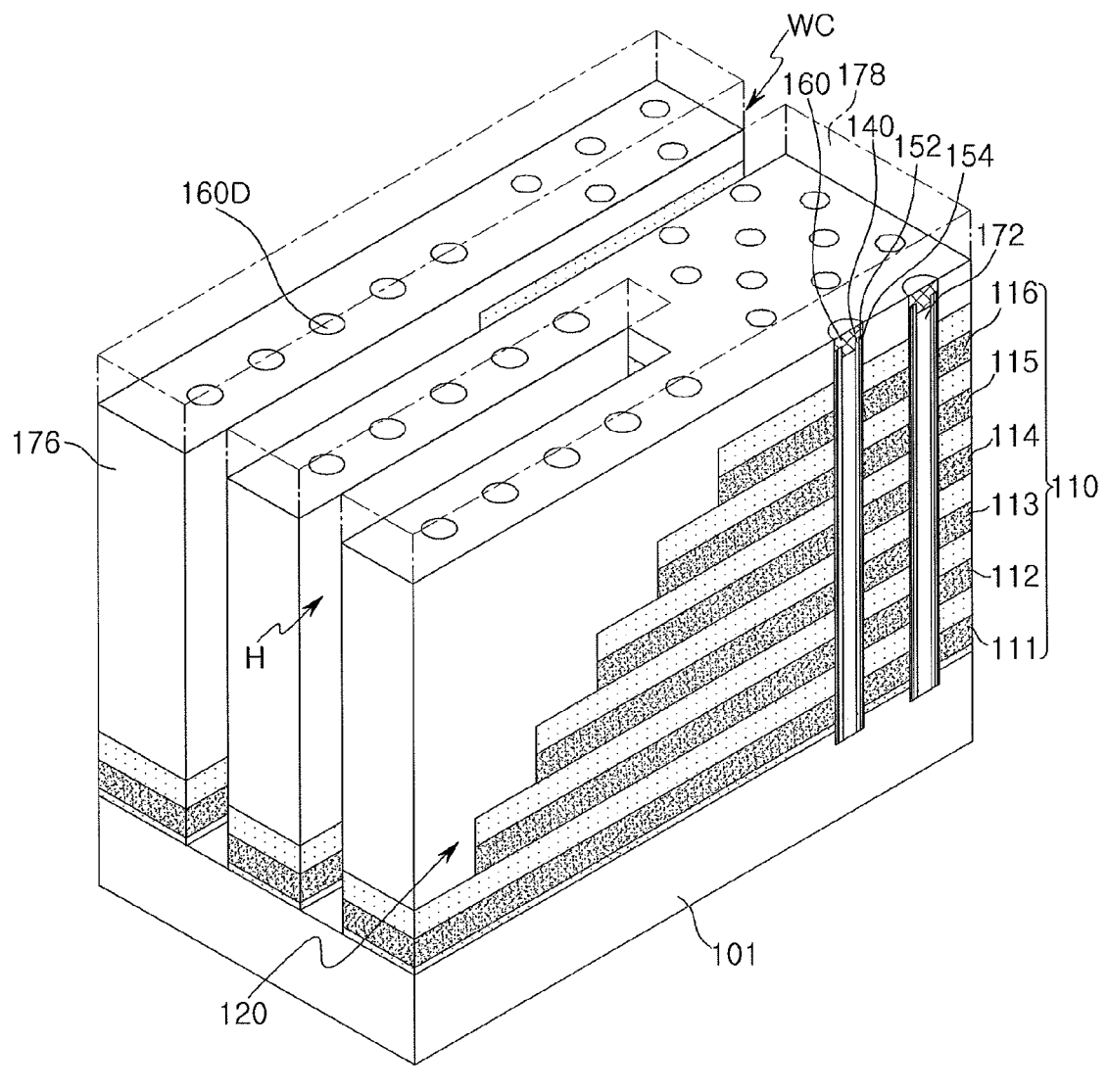

Referring to FIG. 11D a separation opening WC and the pad separation region H, separating the stack of the sacrificial layers 110 and the interlayer insulating layers 120 by predetermined distances, may be formed.

Prior to formation of the separation opening WC and the pad separation region H, a fifth insulating layer 178 may be formed on the uppermost interlayer insulating layer 127 and the drain pad 160 to prevent damage to the drain pad 160, the channel 140 disposed below the drain pad 160, or the like.

The separation opening WC may expose the substrate 101 between the channels 140, and the pad separation region H may expose the substrate 101 between the dummy pillars 160D. The separation opening WC may have a linear shape extending in the x-direction, whereby the gate stacks 130 spaced apart from each other may be defined. The pad separation region H crossing a single gate stack 130 defined by the separation opening WC in the x-direction in the pad region PAD (see FIG. 3) may be formed, together with the separation opening WC. In a follow-up process, the common source line 180 (see FIG. 3) and the dummy common source line 180D may be respectively formed on portions of the substrate 101 exposed by the separation opening WC and the pad separation region H.

The separation opening WC and the pad separation region H may be formed, for example, by forming a mask layer using a photolithography process and anisotropically etching the sacrificial layers 110 and the interlayer insulating layers 120.

Figure 11E:
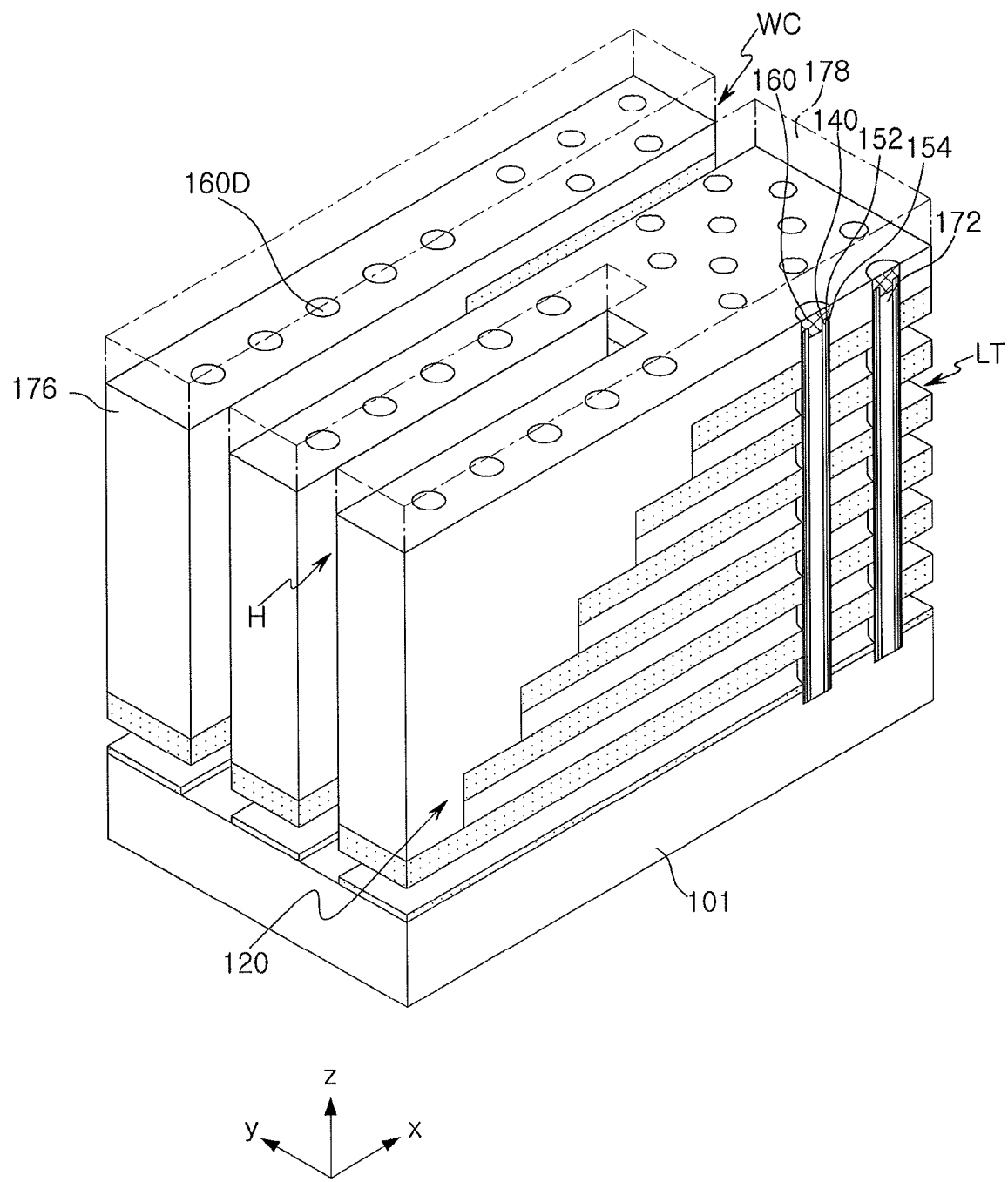

Referring to FIG. 11E, the sacrificial layers 110 exposed by the separation opening WC and the pad separation region H may be removed by an etching process. Accordingly, a plurality of lateral openings LT defined between the interlayer insulating layers 120 may be formed. The side wall of the channel 140 may be partially exposed through the lateral openings LT.

In this process, since the dummy pillars 160D are formed at predetermined intervals in the pad region, the interlayer insulating layers 120 may be stably supported without being bent, even after removal of the sacrificial layers 110.

Figure 11F:
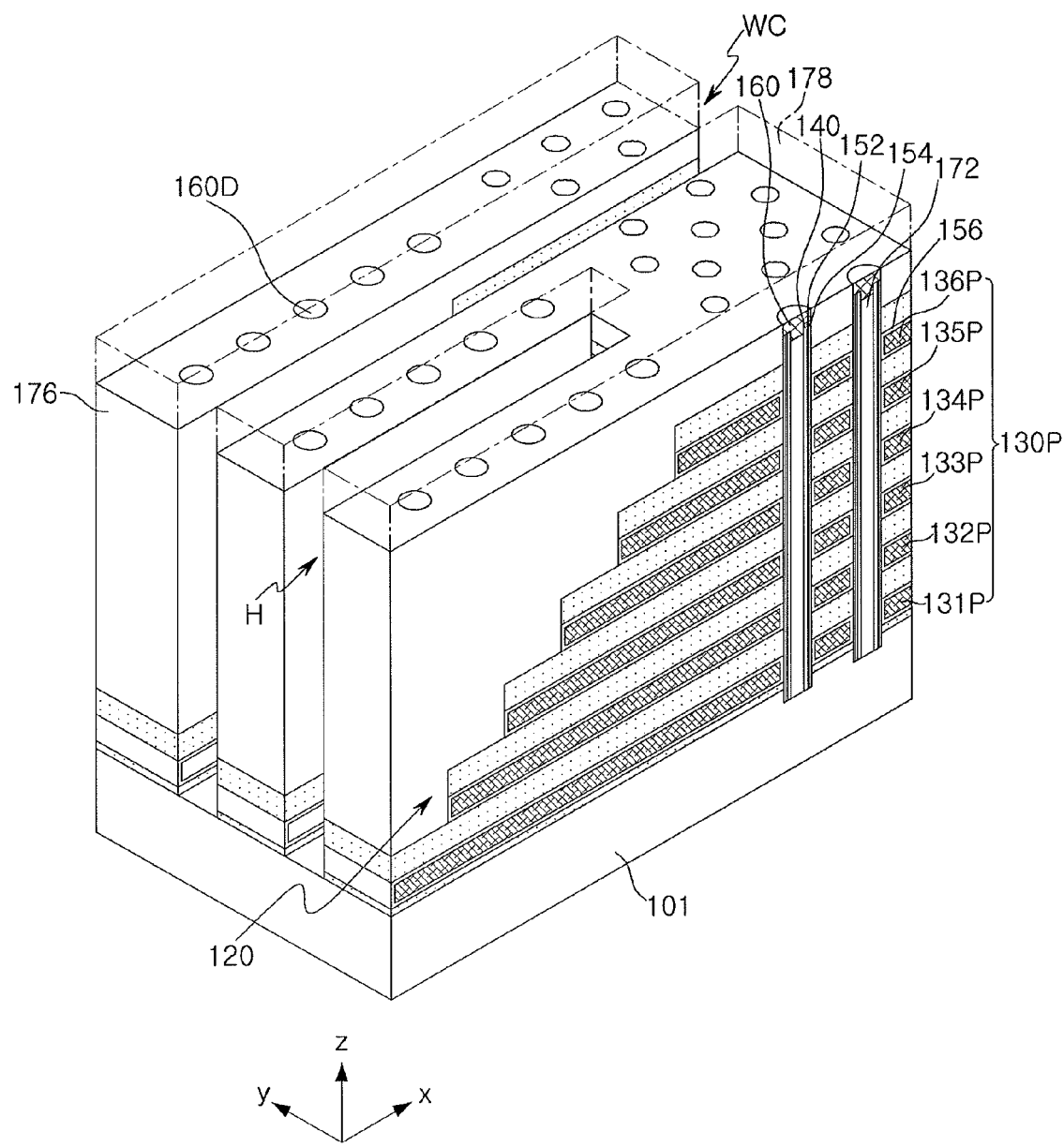

Referring to FIG. 11F, the blocking layer 156 and gate conductive layers 131P to 136P (130P) may be formed within the lateral openings LT. First, the blocking layer 156 may be formed to uniformly cover the charge storing layer 154 and the interlayer insulating layers 120 exposed by the separation opening WC, the pad separation region H, and the lateral openings LT. Then, the gate conductive layers 130P may be formed such that the lateral openings LT may be filled.

The gate conductive layer 130P may be formed of, for example, polysilicon. The blocking layer 156 and the gate conductive layers 130P may be formed using ALD, CVD, or physical vapor deposition (PVD).

In order to form the blocking layer 156 and the gate conductive layers 130P only within the lateral openings LT, a material of the blocking layer 156 and the gate conductive layers 130P formed in the separation opening WC and the pad separation region H may be removed through an additional process. In another embodiment, such a process may be performed in a subsequent process.

Figure 11G:
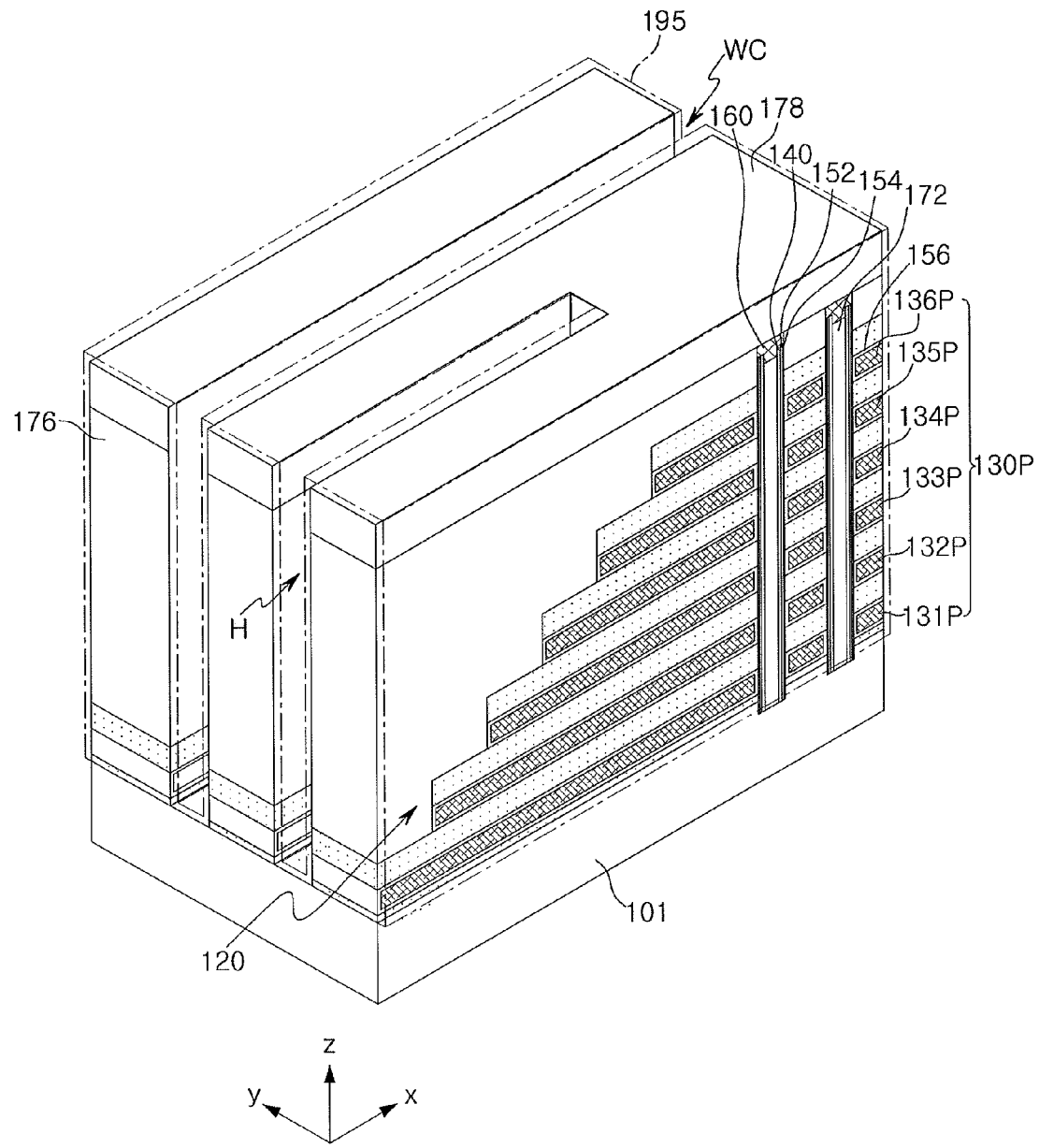

Referring to FIG. 11G, a metal layer 195 may be formed within the separation opening WC and the pad separation region H so as to cover the gate conductive layers 130P, and a silicidation process of the gate conductive layers 130P may be performed.

The metal layer 195 may be a material for making the gate conductive layers 130P formed of polysilicon into a metal silicide. The metal layer 195 may be a metal selected from among, for example, cobalt (Co), nickel (Ni), hafnium (Hf), platinum (Pt), tungsten (W), and titanium (Ti). After the formation of the metal layer 195, a thermal treatment process may be undertaken, whereby metal elements of the metal layer 195 may be diffused and silicidation of the gate conductive layers 130P may be conducted to form the gate stacks 130 illustrated in FIG. 11H. This may allow for a reduction in resistance. Subsequently, the remainder of the metal layer 195 may be removed.

When the pad separation region H is not formed, the volume of the gate conductive layers 130P to be silicided may be greater in the pad region than in the cell region in which the channel pillars are formed with relatively high density. In this case, when the time required for silicidation is increased in accordance with the volume of the gate conductive layers 130P in the pad region, the adjacent gate conductive layers 130P vertically disposed may be silicided to come into contact with each other in the separation opening WC, thereby forming a bridge. In addition, when the time required for silicidation is determined in accordance with the volume of the gate conductive layers 130P in the cell region, the gate conductive layers 130P present in the pad region may be insufficiently silicided. At the time of forming the contact plugs 190 in a subsequent process, a punching phenomenon may occur in which the contact plugs 190 penetrate through respective ones of the gate electrode layers 131 to 136 to which the contact plugs 190 should be connected.

In one embodiment, as the pad separation region H is formed, the volume of the gate conductive layers 130P to be silicided may be reduced in the pad region. In addition, due to the pad separation region H, a difference may occur in volumes of the gate conductive layers 130P generated between the cell region in which the channels 140 are formed with high density. The pad region may therefore be significantly reduced. Thus, the gate conductive layers 130P may be fully silicided in both of the cell region and the pad region. For example, the difference in volumes may be generated such that the volume of a single gate conductive layer 130P in the pad region may be a predetermined number (e.g., 0.5 to 1.5) of times the volume thereof in the cell region.

Figure 11H:
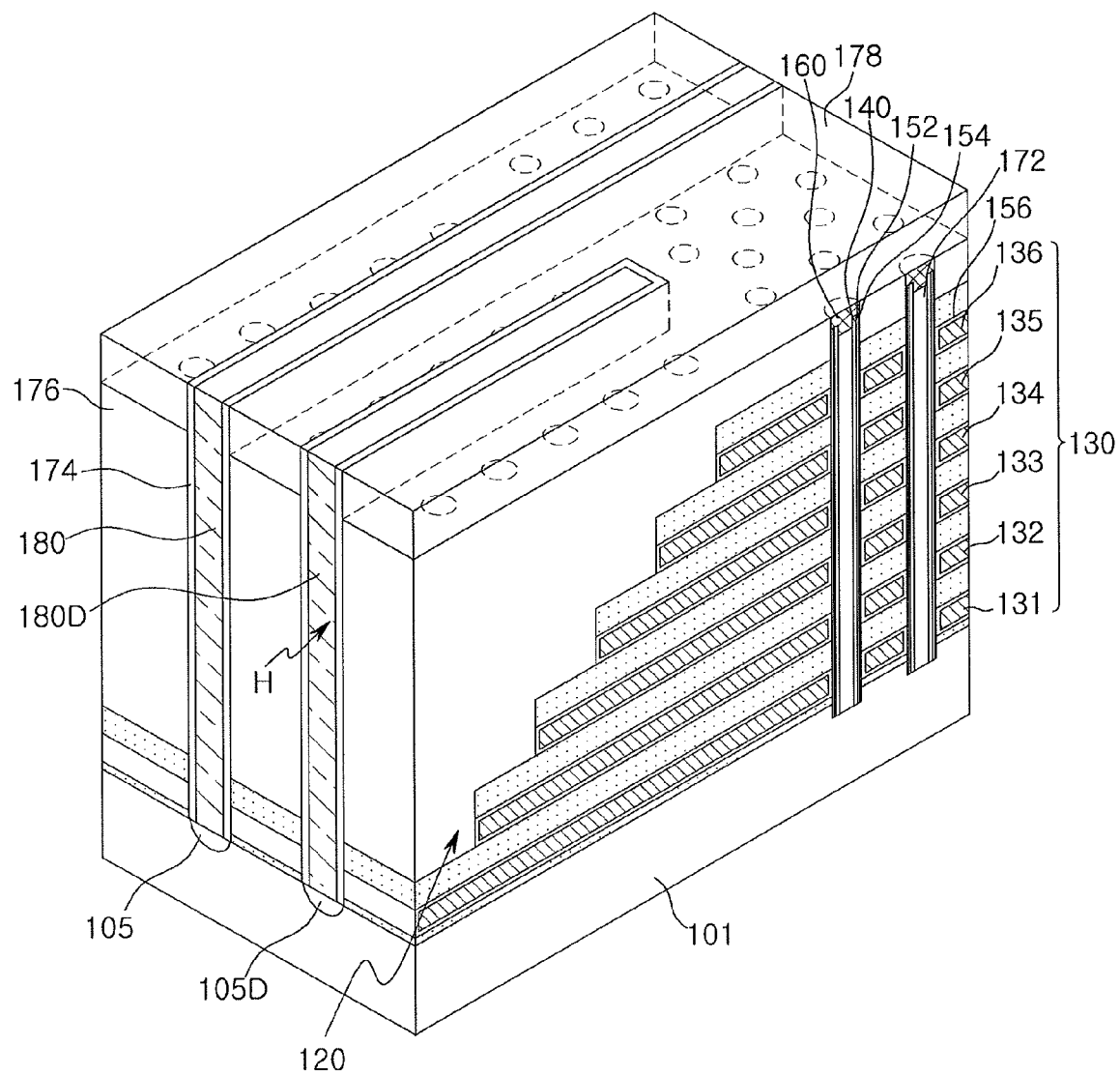

Referring to FIG. 11H, the doped region 105 and the dummy doped region 105D may be formed in portions of the substrate 101 present within the separation opening WC and the pad separation region H. The common source line 180 and the dummy common source line 180D may be formed on the doped region 105 and the dummy doped region 105D.

First, the doped region 105 and the dummy doped region 105D may be formed by injecting impurities into the exposed portions of the substrate 101 exposed by the separation opening WC and the pad separation region H. Then, the third insulating layer 174 may be formed on each side wall of the separation opening WC and the pad separation region H and the common source line 180 and the dummy common source line 180D may be formed, respectively. The common source line 180 and the dummy common source line 180D may be simultaneously formed in the process, and thus may include the same material.

In one embodiment, the doped region 105 and the dummy doped region 105D may be formed after the third insulating layer 174 is formed, and may be configured to include a high concentration region and low concentration regions disposed at both ends thereof. Further, in the above-mentioned process described with reference to FIG. 11G, the doped region 105 and the dummy doped region 105D may be silicided by the metal layer 195.

Figure 11I:
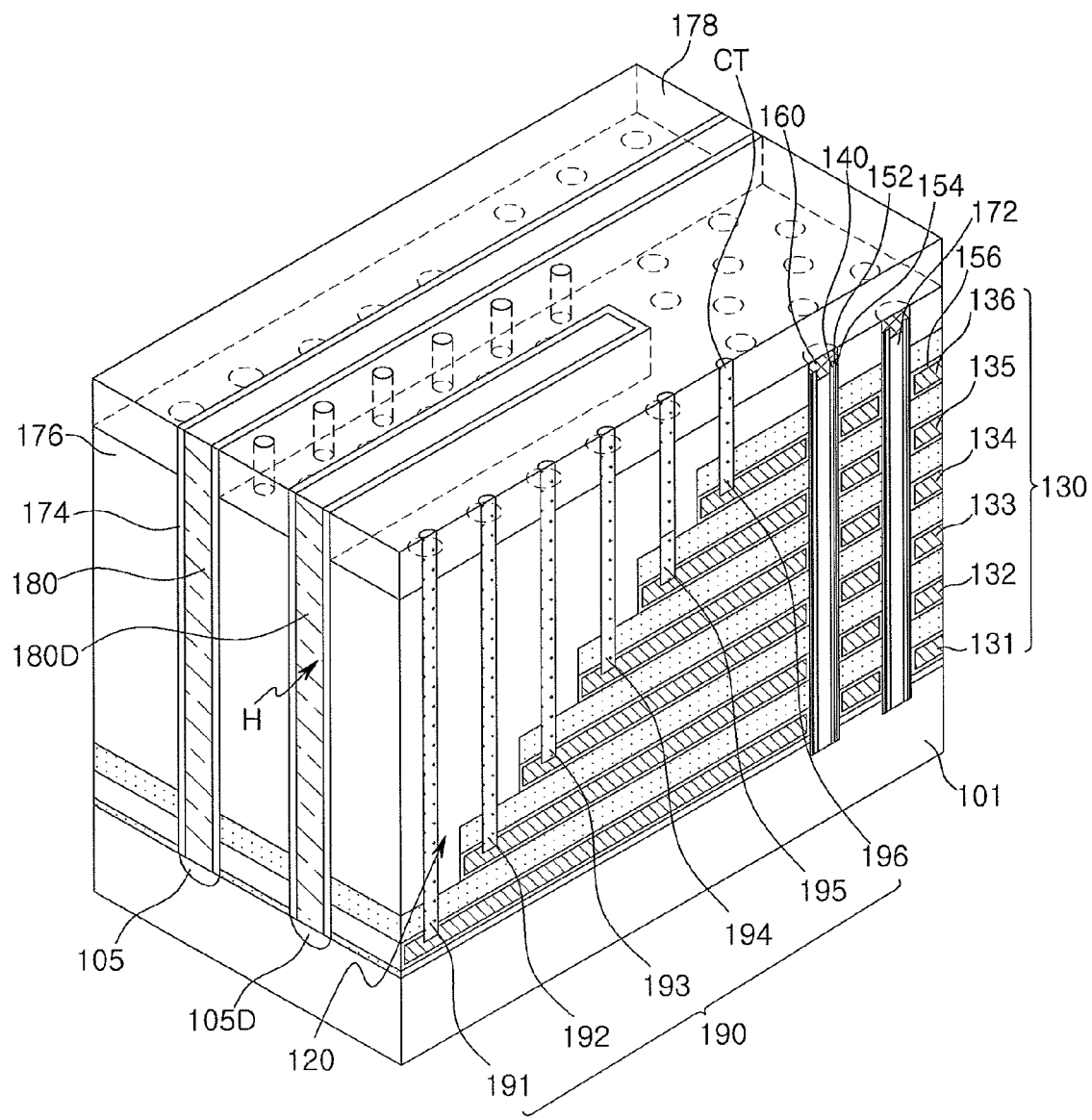

Referring to FIG. 11I, the contact plugs 190 connected to the respective gate electrode layers 131 to 136 may be formed in the pad region. After openings CT connected to the gate electrode layers 131 to 136 are first formed by etching the fourth and fifth insulating layers 176 and 178 and the interlayer insulating layers 120, a conductive material is deposited therein to form the contact plugs 190. The openings CT may be formed to penetrate through at least portions of the gate electrode layers 131 to 136.

When the openings CT are formed, an etchant having relatively high etch selectivity may be used between the gate electrode layers 131 to 136 that are fully silicided, and the fourth and fifth insulating layers 176 and 178 formed of, for example, a silicon oxide. Therefore, a defect (such as formation of a bridge or an electrical short between adjacent ones of the gate electrode layers 131 to 136 vertically disposed at the time of forming the contact plugs 190) may be prevented. For example, when a portion of the gate electrode layers 131 to 136 is not silicided and polysilicon remains therein, the gate electrode layers 131 to 136 may have a relatively low degree of etch selectivity with respect to the fourth and fifth insulating layers 176 and 178. Thus, the openings CT may penetrate through the interlayer insulating layers 120 disposed below some of the gate electrode layers 131 to 136, thereby causing an electrical short between the adjacent gate electrode layers 131 to 136 that are vertically disposed.

Although FIG. 11I illustrates a case in which portions of the gate electrode layers 131 to 136 are recessed and the contact plugs 190 fill the recessed portions of the gate electrode layers 131 to 136, the contact plugs 190 may be formed to contact upper surfaces of the gate electrode layers 131 to 136 in another embodiment.

Figure 12:
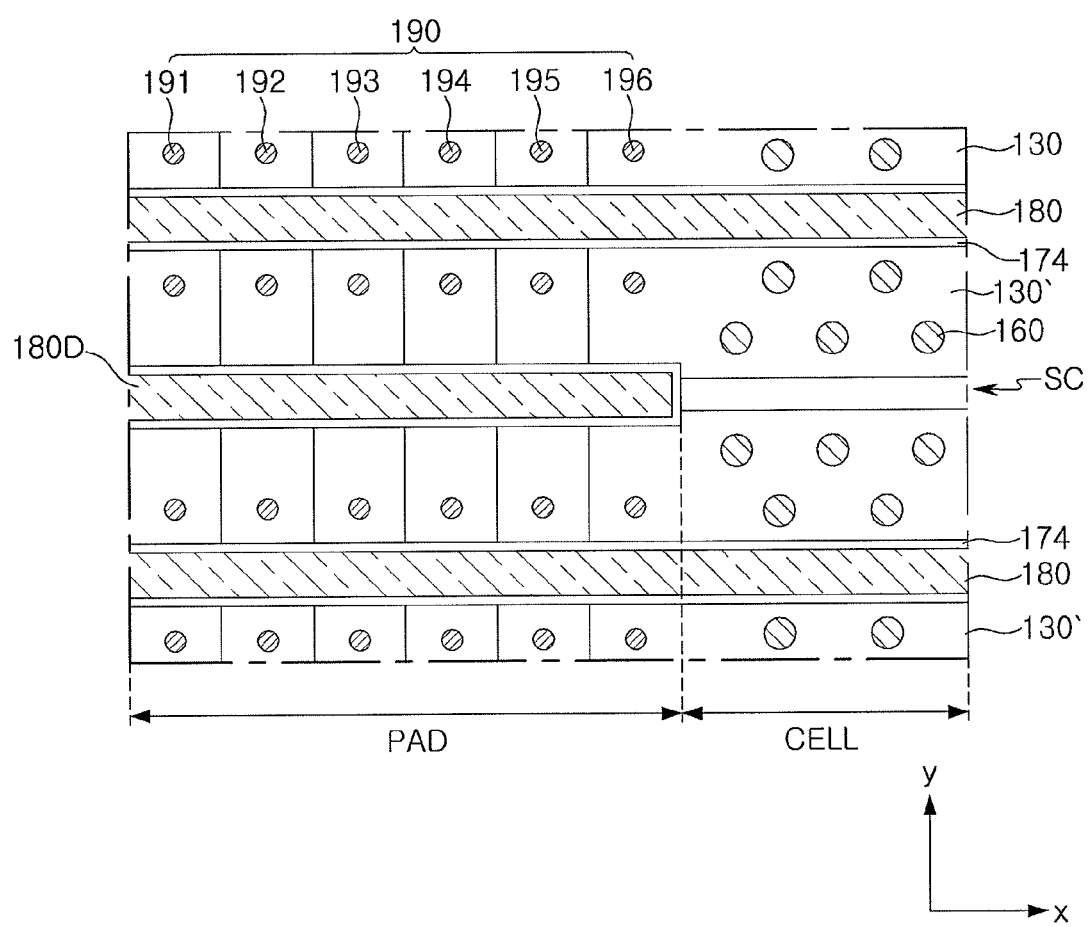
FIGS. 12 and 13 illustrate another embodiment of a semiconductor device.
Figure 13:
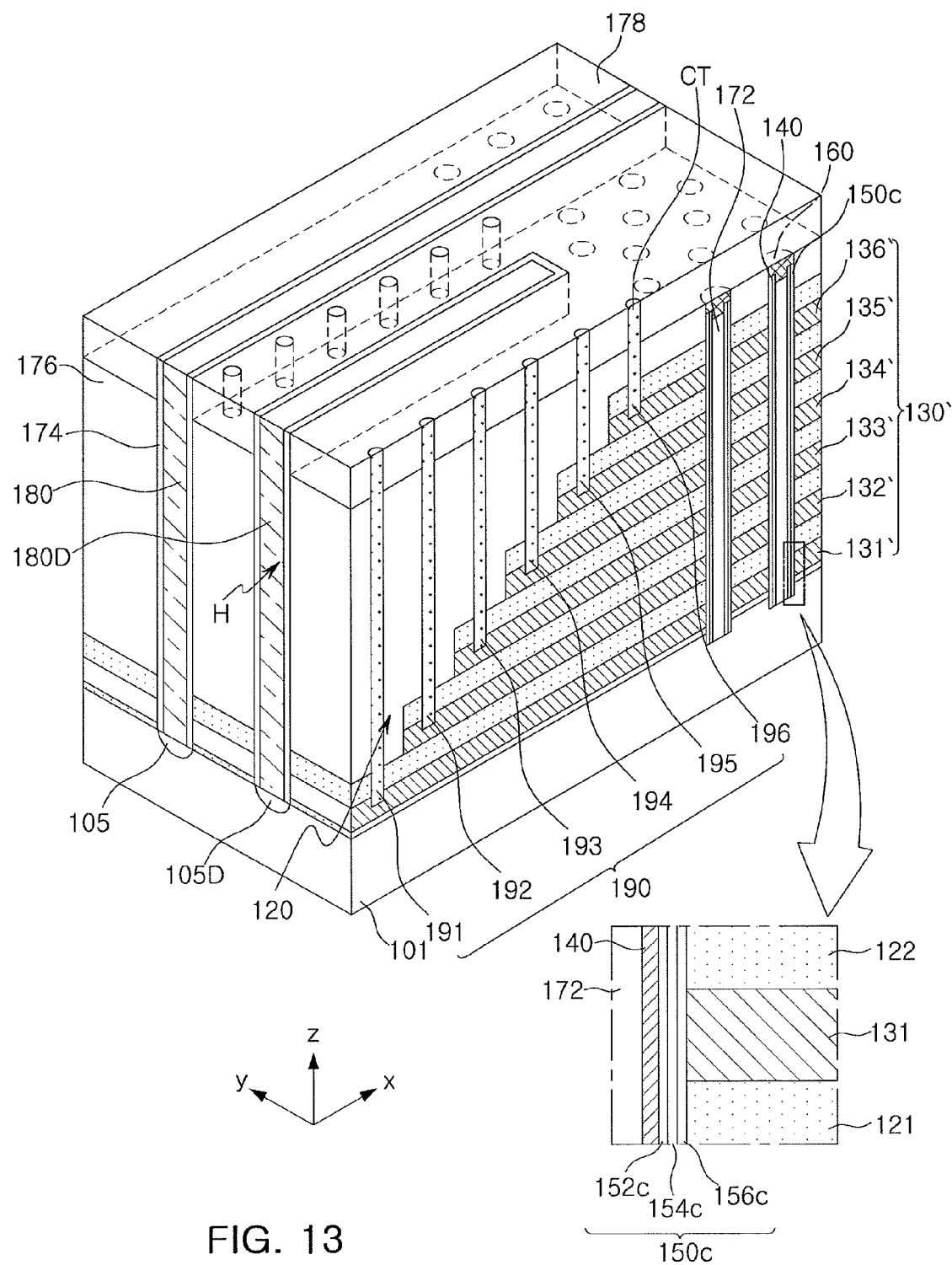

FIGS. 12 and 13 another embodiment of a semiconductor device 100d which includes the substrate 101, gate electrode layers 131' to 136' stacked on the substrate 101 and spaced apart from each other in the z-direction and forming gate stacks 130', a plurality of the interlayer insulating layers 120 alternately stacked with the gate electrode layers 131' to 136', and gate dielectric layers 150c. Further, the semiconductor device 100d may include the drain pads 160, the common source line 180, the dummy common source line 180D, and the contact plugs 190.

In the semiconductor device 100d, disposition of the gate dielectric layers 150c may be different from that in the embodiment of FIGS. 3 through 4D. Further, the semiconductor device 100d may not include the dummy pillars 160D and the separation region dummy pillars 165. This is because the formation and removal processes of the sacrificial layers 110 described with reference to FIGS. 11A through 11E may not be performed.

The gate dielectric layers 150c may be disposed between the gate electrode layers 131' to 136' and the respective channels 140, and may extend along the channels 140 in a direction perpendicular with respect to the substrate 101. As illustrated in FIG. 13, the gate dielectric layers 150c may include a tunneling layer 152c, a charge storing layer 154c, and a blocking layer 156c sequentially stacked from each channel 140.

FIGS. 14A through 14D illustrating another embodiment of a method for manufacturing a semiconductor device, which, for example, may correspond to the embodiment of FIGS. 12 and 13. Hereinafter, portions different from those of the embodiment described with reference to FIGS. 11A to 11I will be mainly explained.

Figure 14A:
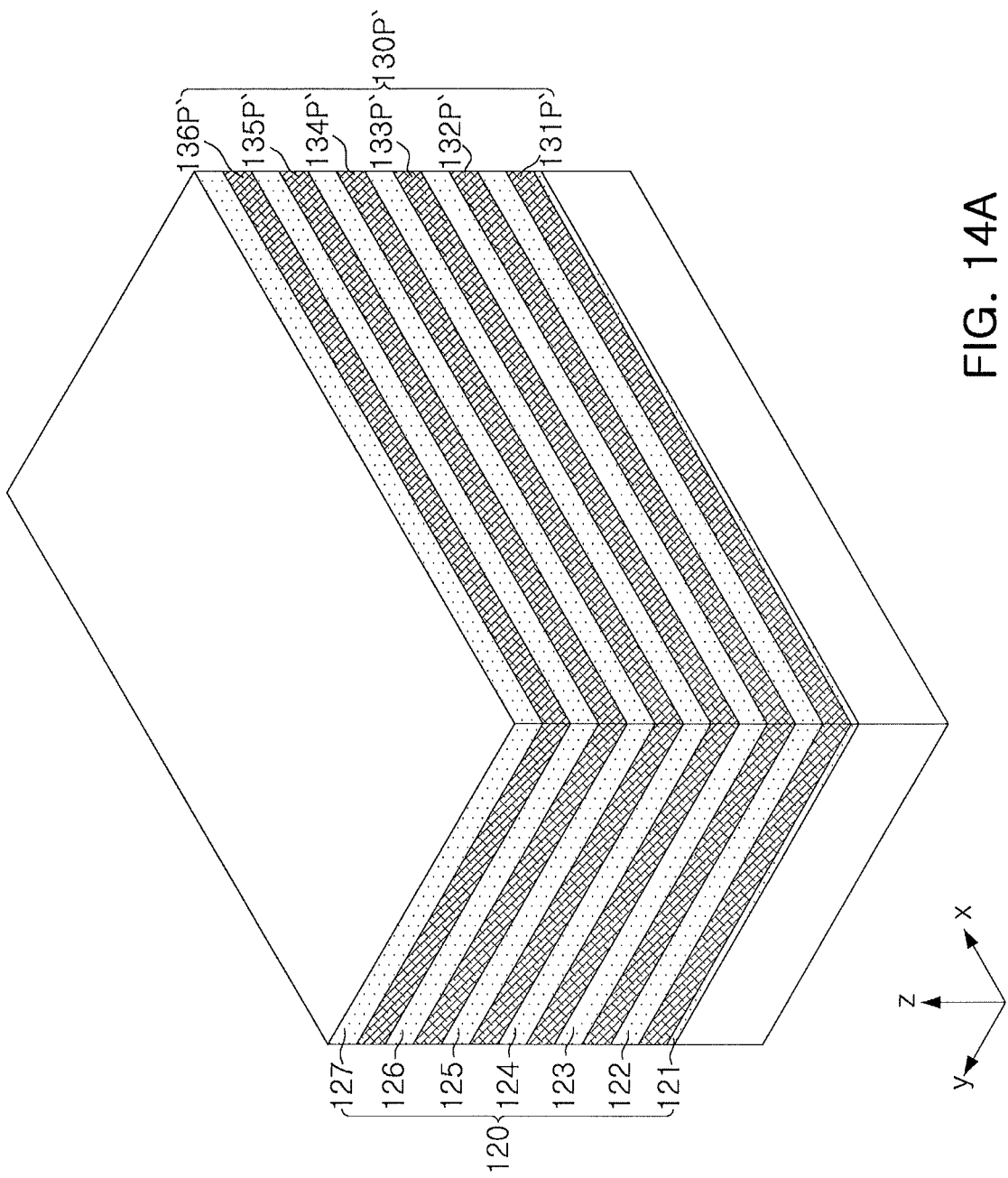
FIGS. 14A to 14D illustrate another embodiment of a method for manufacturing a semiconductor device.

Referring to FIG. 14A, the plurality of interlayer insulating layers 120 and a plurality of gate conductive layers 131P' to 136P' (130P') may be alternately stacked on the substrate 101. The interlayer insulating layers 120 and the gate conductive layers 130P' may be formed, for example, of polysilicon.

Figure 14B:
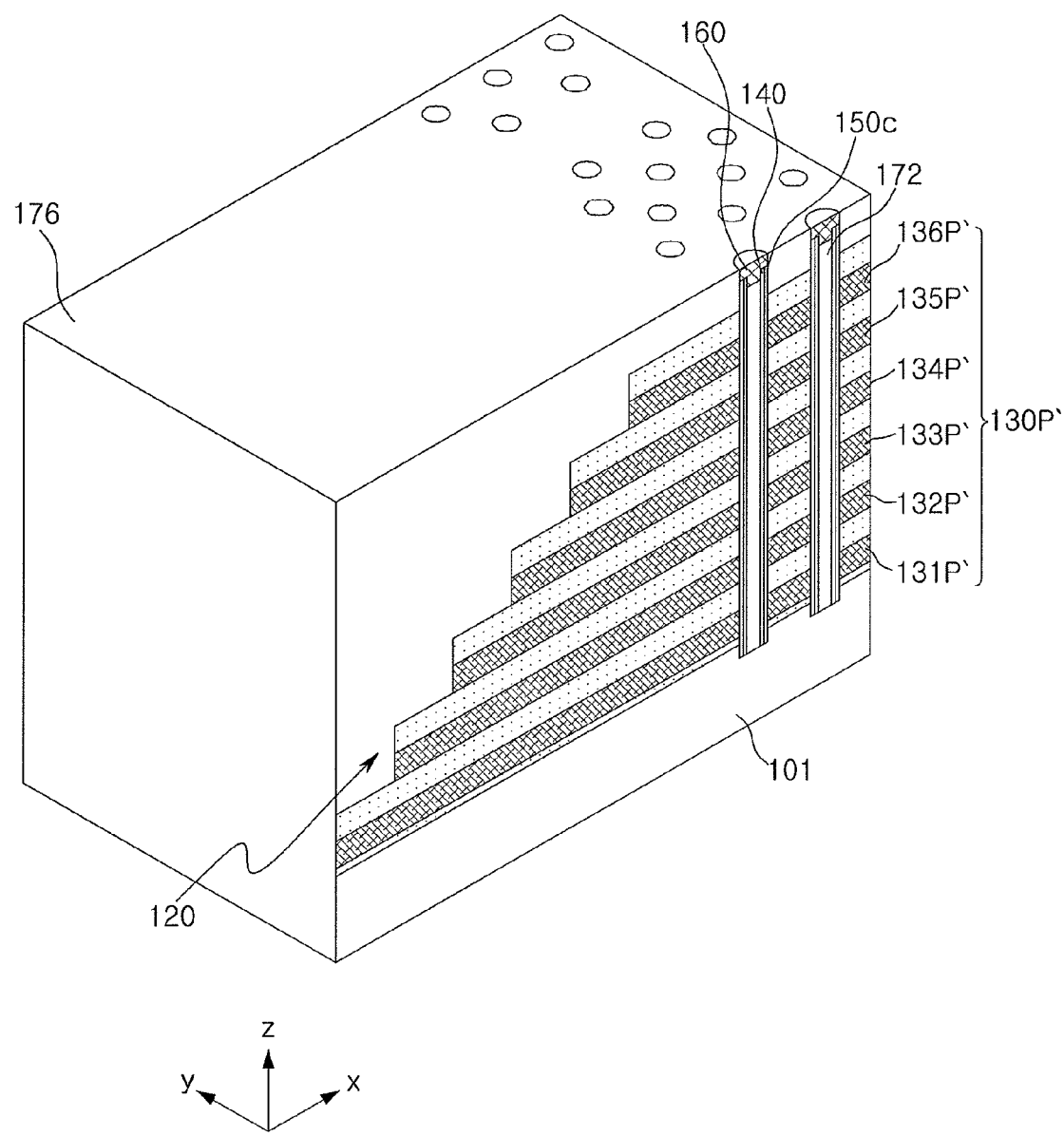

Referring to FIG. 14B, a process may be performed in a similar manner to the step portion formation process and the channel pillar formation process in the pad region described with reference to FIGS. 11B and 11C. However, in one embodiment, the entirety of the gate dielectric layers 150c including the tunneling layer 152c, the charge storing layer 154c, and the blocking layer 156c may be formed prior to formation of the channel 140.

Figure 14C:
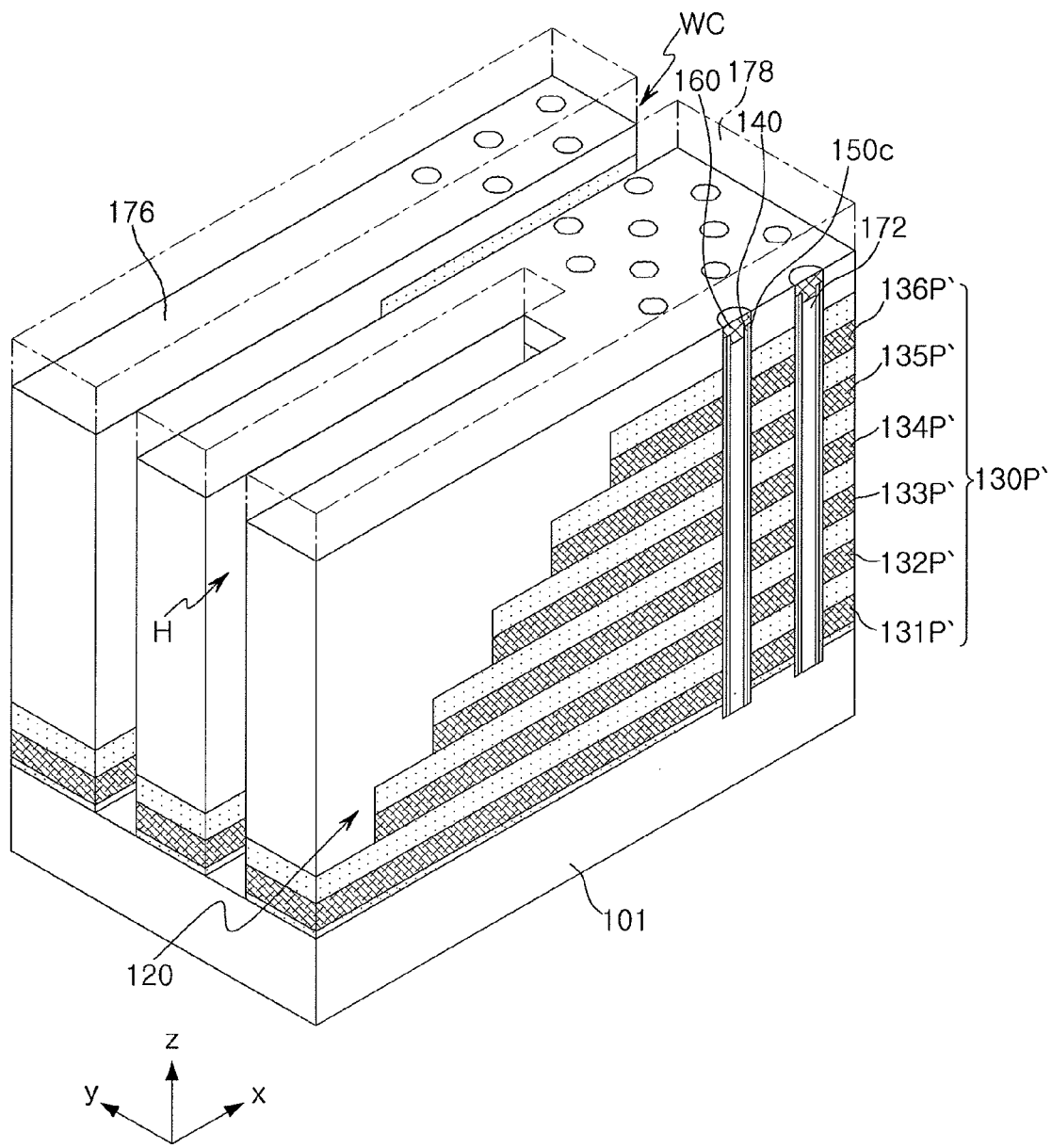

Referring to FIG. 14C, similarly to the case described with reference to FIG. 11D, the separation opening WC and the pad separation region H separating a stack of the interlayer insulating layers 120 and the gate conductive layers 130P' by predetermined distances may be formed.

Figure 14D:
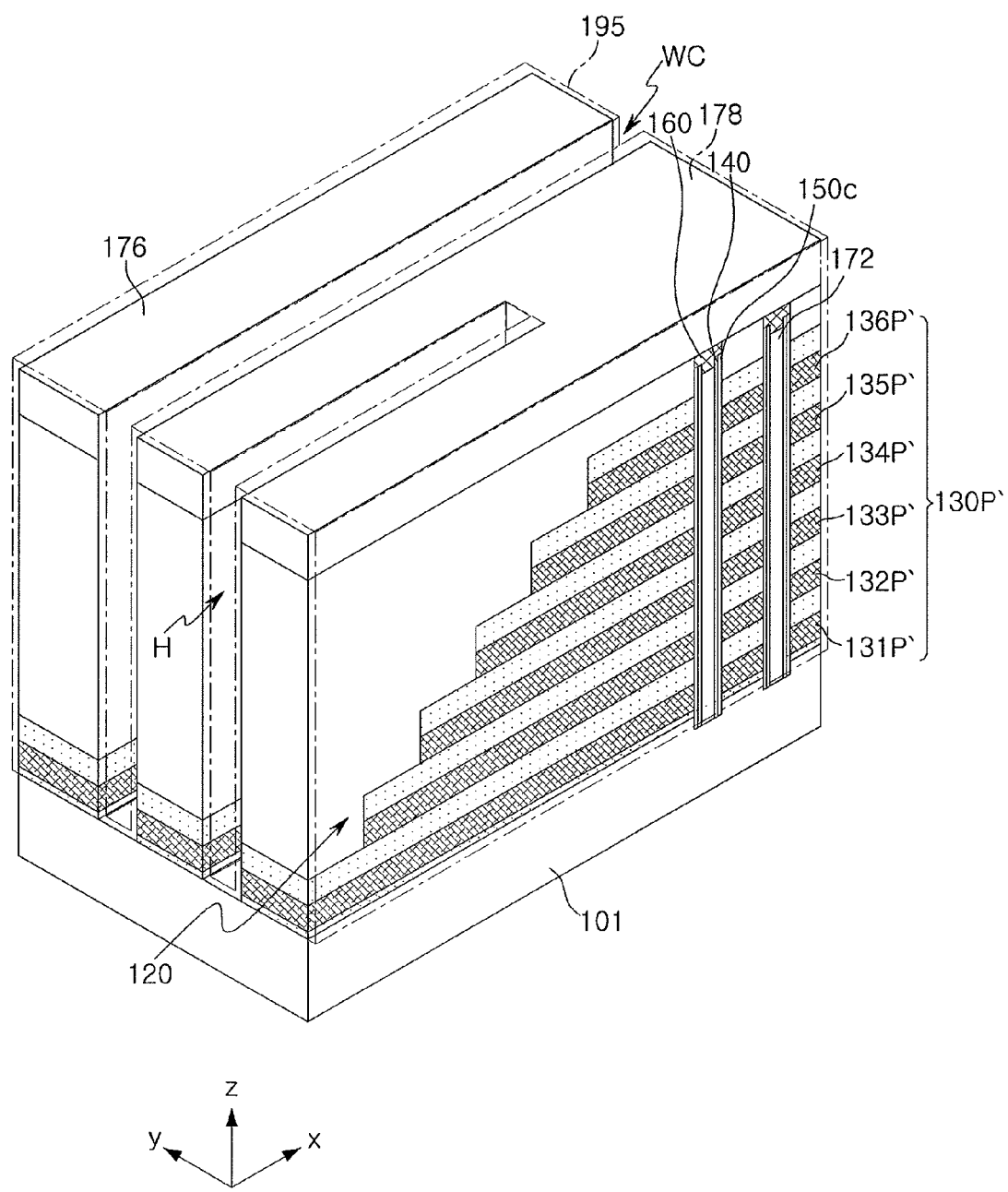

Referring to FIG. 14D, similarly to the case described with reference to FIG. 11G, the metal layer 195 may be formed within the separation opening WC and the pad separation region H so as to cover the gate conductive layers 130P', and a silicidation process of the gate conductive layers 130P' may be performed.

Next, as described with reference to FIGS. 11H and 11I, the doped region 105 and the dummy doped region 105D may be formed, and the common source line 180 and the dummy common source line 180D may be formed on the doped region 105 and the dummy doped region 105D, respectively. In addition, the contact plugs 190 connected to the respective gate electrode layers 131' to 136' may be formed in the pad region.

Figure 15:
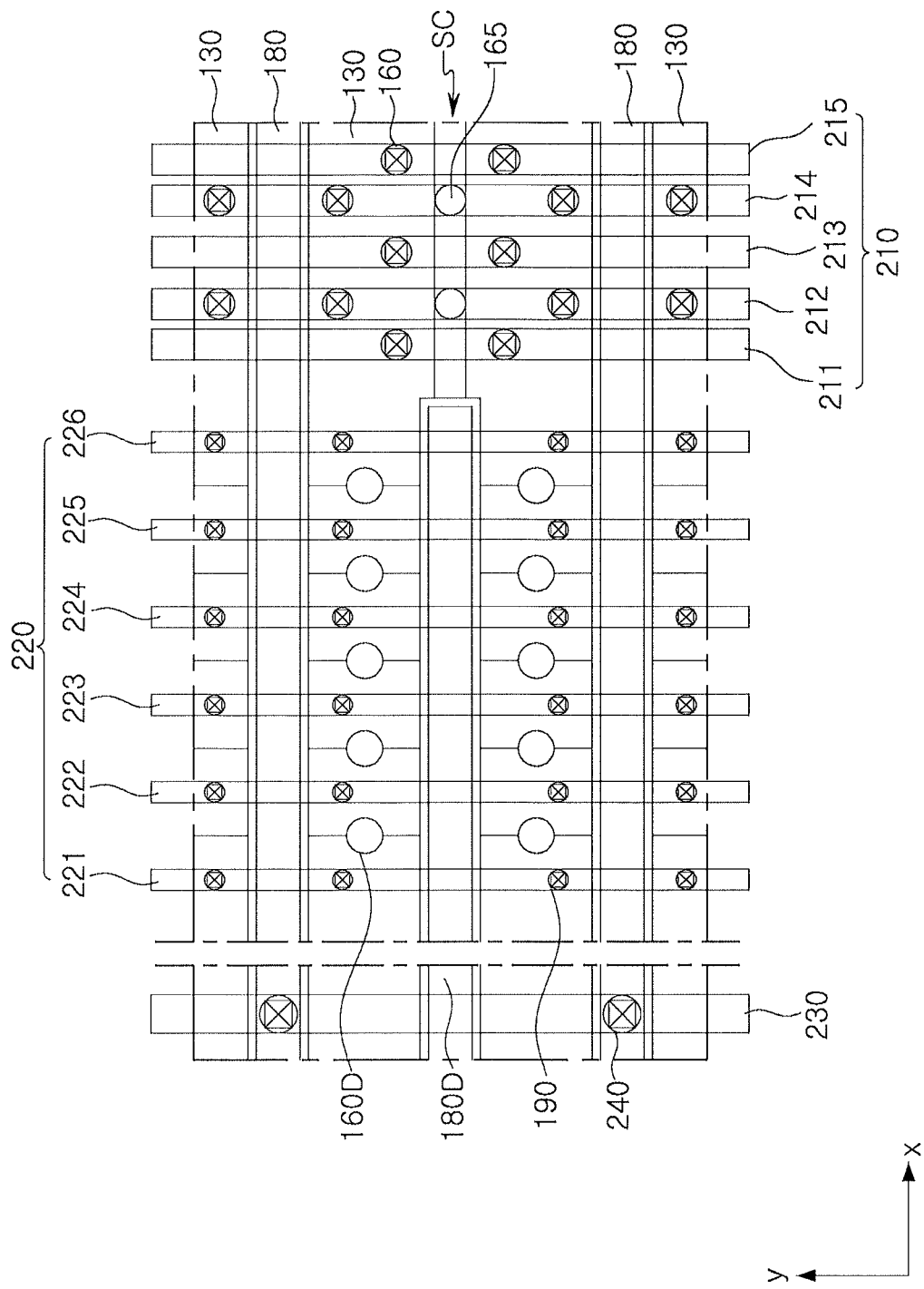
FIG. 15 illustrates another embodiment of a semiconductor device.

FIG. 15 illustrates wiring structures for one embodiment of a semiconductor device. Referring to FIG. 15, the semiconductor device includes bit lines 211 to 215 (210) connected to the drain pads 160 in a cell region, first wiring lines 221 to 226 (220) connected to the contact plugs 190 in a pad region, and a second wiring line 230 connected to the common source line 180.

The respective bit lines 210 may extend and be connected to the drain pads 160 of the channel pillars arranged in the same row in the y-direction. In one embodiment, the bit lines 210 may not be electrically connected to the separation region dummy pillars 165 of the line separation region SC. In addition, the bit lines 210 may not be electrically connected to the dummy pillars 160D.

The respective first wiring lines 220 may extend and be connected to the contact plugs 190 arranged in the same row in the y-direction. The second wiring line 230 may be connected to the common source line 180 through a source contact 240 in one region of the semiconductor device. However, the second wiring line 230 may not be electrically connected to the dummy common source line 180D. Thus, as illustrated in FIG. 15, the source contact 240 may not be disposed on the dummy common source line 180D. In one embodiment, the second wiring line 230 may be connected to the common source line 180 in various ways and may not be electrically connected to the dummy common source line 180D.

Figure 16:
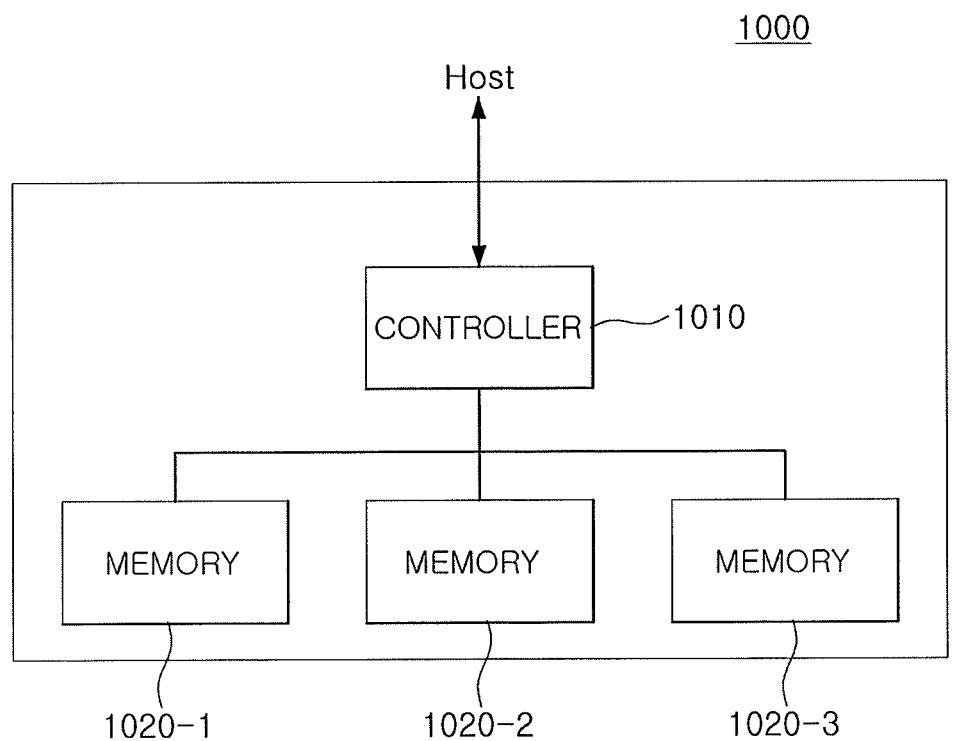
FIG. 16 illustrates an embodiment of a storage apparatus.

FIG. 16 illustrates an embodiment of a storage apparatus 1000 which includes a controller 1010 and a plurality of memories 1020-1, 1020-2 and 1020-3 for storing data. The controller 1010 may communicate with a host. The respective memories 1020-1, 1020-2, and 1020-3 may include the semiconductor devices according to any of the aforementioned embodiments described with reference to FIGS. 1 to 15.

Examples of the host include various electronic devices on which the storage apparatus 1000 is mounted. For example, the host may be, for example, a smartphone, a digital camera, a desktop computer, a laptop computer, a media player, or another type of electronic device. The controller 1010 receives a data writing or reading request from the host to store data in the memories 1020-1, 1020-2, and 1020-3, and/or generate a command (CMD) for fetching data from the memories 1020-1, 1020-2 and 1020-3.

As illustrated in FIG. 16, at least one or more memories 1020-1, 1020-2, and 1020-3 may be connected to the controller 1010 in parallel in the storage apparatus 1000. The memories 1020-1, 1020-2, and 1020-3 may be connected to the controller 1010 in parallel, and thus the storage apparatus 1000 may have a high (or predetermined) capacity to implement a solid state drive.

Figure 17:
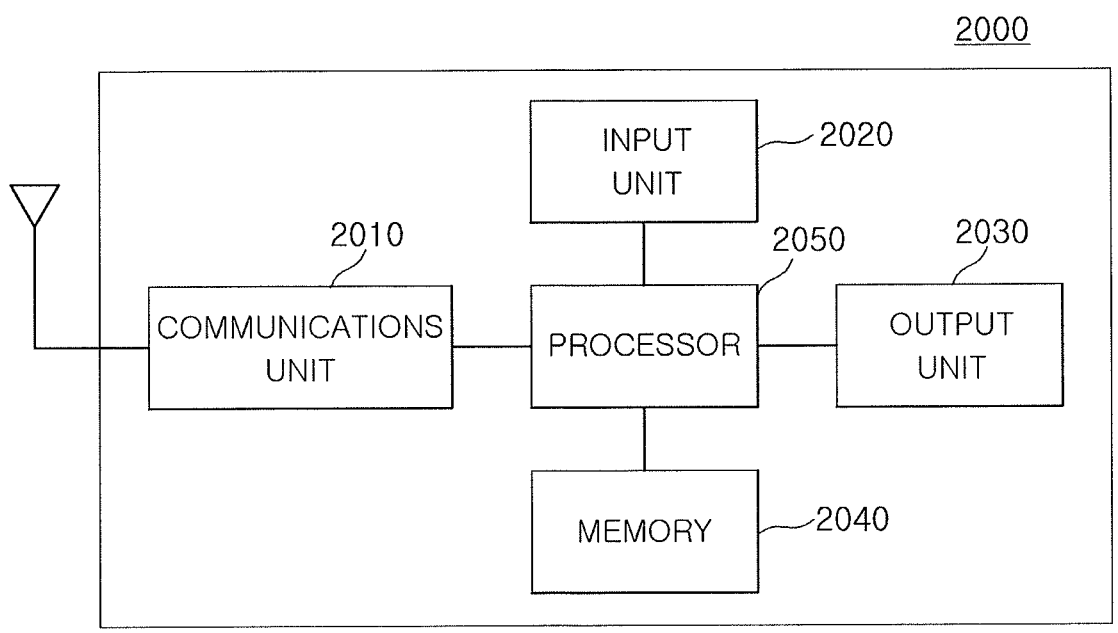
FIG. 17 illustrates an embodiment of an electronic apparatus.

FIG. 17 illustrates an embodiment of an electronic apparatus 2000 which includes a communications unit 2010, an input unit 2020, an output unit 2030, a memory 2040, and a processor 2050.

The communications unit 2010 may include a wired or wireless communications module, a wireless Internet module, a local area communications module, a global positioning system (GPS) module, a mobile communications module, and the like. The wired or wireless communications module included in the communications unit 2010 may be connected to external communications networks according to various communications standard specification to transmit and receive data.

The input unit 2020 may be a module provided to control an operation of the electronic apparatus 2000 by a user and may include a mechanical switch, a touchscreen, a voice recognition module, and the like. In addition, the input unit 2020 may include a mouse operating in a track ball or a laser pointer scheme or a finger mouse device. In addition to these, the input unit 2020 may include various sensor modules allowing for a user to input data thereto.

The output unit 2030 may output information processed in the electronic apparatus 2000 in a sound or image form, and the memory 2040 may store programs for the processing and the control of the processor 2050. The memory 2040 may include at least one semiconductor device according to any of the aforementioned embodiments as described with reference to FIGS. 1 to 15. The processor 2050 may transfer a command to the memory 2040 according to a required operation to thereby store or fetch data.

The memory 2040 may be embedded in the electronic apparatus 2000 to communicate with the processor 2050 or communicate with the processor 2050 through a separate interface. When the memory 2040 communicates with the processor 2050 through a separate interface, the processor 2050 may store or retrieve data, through various interface standards such as secure digital (SD), secure digital high capacity (SDHC), secure digital extended capacity (SDXC), MICRO SD, Universal Serial Bus (USB), and the like.

The processor 2050 may control operations of respective components in the electronic apparatus 2000. The processor 2050 may perform control and processing in association with voice communications, video telephony, data communications, and/or may perform control and processing for multimedia reproduction and management. In addition, the processor 2050 may process an input transferred from a user through the input unit 2020 and may output results thereof through the output unit 2030. In addition, the processor 2050 may store data required in controlling the operation of the electronic apparatus 2000 as described above, in the memory 2040, or fetch data from the memory 2040.

By way of summation and review, in a vertical-type non-volatile memory device, a metal silicide such as NiSi may be used in gate electrode layers. In this case, a difference in amounts (volumes) of silicon to be silicided in a cell region and a pad region may be significant. Thus, in a case in which a silicidation process is conducted in accordance with the cell region, polysilicon may not be fully silicided in the pad region. Accordingly, in the case of forming contact plugs, a defect in which the contact plugs are punched into the gate electrode layers disposed therebelow may occur, due to differences in degrees of etch selectivity. In addition, the silicidation process is conducted in accordance with the pad region, a bridge due to an increase in volume between the gate electrode layers vertically disposed may be caused.

In accordance with one or more of the aforementioned embodiments, a semiconductor device is provided which has improved reliability by allowing for full silicidation of gate electrode layers during a manufacturing process. This may be accomplished through the formation of a pad separating part separating a gate stack in a pad region.

In these or other embodiments, when a separation opening provided to remove a sacrificial layer is formed, a pad separation region, which is only in a pad region, may be formed simultaneously with the separation opening, between portions of a single gate stack defined by the separation openings. Accordingly, the amount of polysilicon in the pad region may be reduced, whereby a difference in volume of silicon to be silicided in a cell region and a pad region may be decreased. Also, through a subsequent process, a dummy common source line may be formed having a similar structure as that of a common source line formed in the separation opening.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A semiconductor device, comprising:
 a substrate having a pad region adjacent to a cell region;
 a plurality of channels extending in a first direction crossing an upper surface of the substrate in the cell region;
 a gate stack including a plurality of gate electrode layers spaced apart from each other in a second direction on the substrate and enclosing the plurality of channels in the cell region, the plurality of gate electrode layers having different lengths extending into the pad region; and
 a pad separating region crossing the gate stack and separating the gate stack into two or more regions in the pad region; and
 a common source line on at least one side of the gate stack and extending along the cell region and the pad region, wherein the pad separating region includes a dummy source line and an insulating layer electrically separating the dummy source line from the gate stack, and wherein the common source line extends to be substantially parallel to the dummy source line, and extends to be longer than the pad separating region.

2. The semiconductor device as claimed in claim 1, wherein at least one of the plurality of gate electrode layers forms a single region in the cell region and is separated into two or more regions by the pad separating region in the pad region.

3. The semiconductor device as claimed in claim 1, wherein:
 the gate stack extends toward the pad region from the cell region, and
 the pad separating region is between the two or more regions of the gate stack in a direction intersecting a direction in which the gate stack and pad separating region extend.

4. The semiconductor device as claimed in claim 1, wherein the dummy source line has a shape substantially equal to a shape of the common source line.

5. The semiconductor device as claimed in claim 1, wherein the dummy source line is on the substrate and extends to a position higher than a position of an uppermost gate electrode layer, among the plurality of gate electrode layers.

6. The semiconductor device as claimed in claim 1, wherein the dummy source line is a doped region within the substrate.

7. The semiconductor device as claimed in claim 1, further comprising:
 a dummy pillar enclosed by the gate stack in the pad region.

8. The semiconductor device as claimed in claim 7, wherein the dummy pillar includes a substantially planar area larger than a planar area of a channel pillar including the channel.

9. The semiconductor device as claimed in claim 1, further comprising:
 a plurality of contact plugs respectively connected to the plurality of gate electrode layers in the pad region.

10. The semiconductor device as claimed in claim 1, wherein the plurality of gate electrode layers include a metal silicide.

11. The semiconductor device as claimed in claim 10, wherein the metal silicide is a fully silicided metal in the pad region.

* * * * *